(12) United States Patent
Sakuma et al.

(10) Patent No.: US 10,833,103 B2
(45) Date of Patent: Nov. 10, 2020

(54) SEMICONDUCTOR MEMORY DEVICE

(71) Applicant: TOSHIBA MEMORY CORPORATION, Minato-ku (JP)

(72) Inventors: Haruka Sakuma, Yokkaichi (JP); Hidenori Miyagawa, Yokkaichi (JP); Shosuke Fujii, Kuwana (JP); Kiwamu Sakuma, Yokkaichi (JP); Fumitaka Arai, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/563,627

(22) Filed: Sep. 6, 2019

(65) Prior Publication Data

US 2020/0303418 A1 Sep. 24, 2020

(30) Foreign Application Priority Data

Mar. 22, 2019 (JP) .................................. 2019-055014

(51) Int. Cl.
*G11C 11/22* (2006.01)
*H01L 27/11597* (2017.01)
(Continued)

(52) U.S. Cl.
CPC ...... *H01L 27/11597* (2013.01); *G11C 11/223* (2013.01); *G11C 11/2275* (2013.01);
(Continued)

(58) Field of Classification Search
CPC ... G11C 11/22; G11C 11/223; G11C 11/2275; G11C 16/0483; G11C 16/10;
(Continued)

(56) References Cited

U.S. PATENT DOCUMENTS 8,008,732 B2   8/2011   Kiyotoshi et al.
8,779,495 B2   7/2014   Happ et al.
(Continued)

FOREIGN PATENT DOCUMENTS

JP   2004-152893 A   5/2004
JP   2008-78404 A    4/2008
(Continued)

OTHER PUBLICATIONS

A. Hubert, et al, "A stacked SONOS technology, up to 4 levels and 6nm crystalline nanowires, with gate-all-around or independent gates . . . ", IEDM, pp. 637-640, 2009.
(Continued)

*Primary Examiner* — Harry W Byrne
(74) *Attorney, Agent, or Firm* — Oblon, McClelland, Maier & Neustadt, L.L.P.

(57) ABSTRACT

A semiconductor memory device includes: a substrate; a plurality of first semiconductor portions arranged in a first direction intersecting a surface of the substrate; a first gate electrode extending in the first direction, the first gate electrode facing the plurality of first semiconductor portions from a second direction intersecting the first direction; a first insulating portion provided between the first semiconductor portions and the first gate electrode; a first wiring separated from the first gate electrode in the first direction; a second semiconductor portion connected to one end in the first direction of the first gate electrode and to the first wiring; a second gate electrode facing the second semiconductor portion; and a second insulating portion provided between the second semiconductor portion and the second gate electrode.

13 Claims, 32 Drawing Sheets

(51) Int. Cl.
*H01L 29/51* (2006.01)
*G11C 16/04* (2006.01)
*G11C 16/10* (2006.01)
*H01L 27/11556* (2017.01)
*H01L 27/11582* (2017.01)
*H01L 23/528* (2006.01)
*H01L 21/28* (2006.01)
*H01L 21/02* (2006.01)
*H01L 21/311* (2006.01)
*H01L 21/306* (2006.01)

(52) U.S. Cl.
CPC .......... *G11C 16/0483* (2013.01); *G11C 16/10* (2013.01); *H01L 23/528* (2013.01); *H01L 27/11556* (2013.01); *H01L 27/11582* (2013.01); *H01L 29/516* (2013.01); *H01L 29/517* (2013.01); *H01L 21/0217* (2013.01); *H01L 21/02164* (2013.01); *H01L 21/02271* (2013.01); *H01L 21/30604* (2013.01); *H01L 21/31116* (2013.01); *H01L 29/40111* (2019.08)

(58) Field of Classification Search
CPC ............. H01L 27/11597; H01L 23/528; H01L 27/11556; H01L 27/11582; H01L 29/516
USPC ......................................................... 365/145
See application file for complete search history.

(56) References Cited

U.S. PATENT DOCUMENTS

| | | | |
|---|---|---|---|
| 8,907,404 B2 * | 12/2014 | Shukuri | G11C 16/0466 257/326 |
| 9,293,470 B2 | 3/2016 | Sakuma et al. | |
| 9,634,248 B2 | 4/2017 | Ino et al. | |
| 10,153,299 B2 | 12/2018 | Karda et al. | |
| 10,217,667 B2 | 2/2019 | Or-Bach et al. | |
| 10,367,054 B2 * | 7/2019 | Miyagawa | H01L 27/11565 |
| 10,438,801 B2 * | 10/2019 | Sakuma | H01L 27/11546 |
| 2014/0197474 A1 * | 7/2014 | Shukuri | G11C 16/0466 257/324 |
| 2016/0268304 A1 | 9/2016 | Ikeda et al. | |
| 2017/0040379 A1 * | 2/2017 | Sasago | G11C 13/0004 |
| 2018/0269277 A1 * | 9/2018 | Miyagawa | H01L 29/36 |
| 2019/0096683 A1 * | 3/2019 | Sakuma | H01L 27/11521 |

FOREIGN PATENT DOCUMENTS

| | | |
|---|---|---|
| JP | 2009-27136 A | 2/2009 |
| JP | 2016-171243 A | 9/2016 |

OTHER PUBLICATIONS

H-T. Lue, et al, "A Highly Scalable 8-Layer 3D Vertical-Gate (VG) TFT NAND Flash Using Junction-Free Buried Channel BE-SONOS Device," 2010 Symp. on VLSI, pp. 131-132.

W. Kim, et al, "Multi-Layered Vertical Gate NAND Flash Overcoming Stacking Limit for Terabit Density Storage," 2009 Symp. on VLSI, pp. 188-189.

J. Kim, et al, "Novel Vertical-Stacked-Array-Transistor (VSAT) for ultra-high-density and cost-effective NAND Flash memory devices and SSD (Solid State Drive)," 2009 Symp. on VLSI, pp. 186-187.

* cited by examiner

SEMICONDUCTOR MEMORY DEVICE

CROSS-REFERENCE TO RELATED APPLICATIONS

This application is based upon and claims the benefit of Japanese Patent Application No. 2019-055014, filed on Mar. 22, 2019, the entire contents of which are incorporated herein by reference.

FIELD

Embodiments described below relate to a semiconductor memory device.

BACKGROUND

Description of the Related Art

High density integration of semiconductor memory devices has been developed.

DETAILED DESCRIPTION

Figure 1:
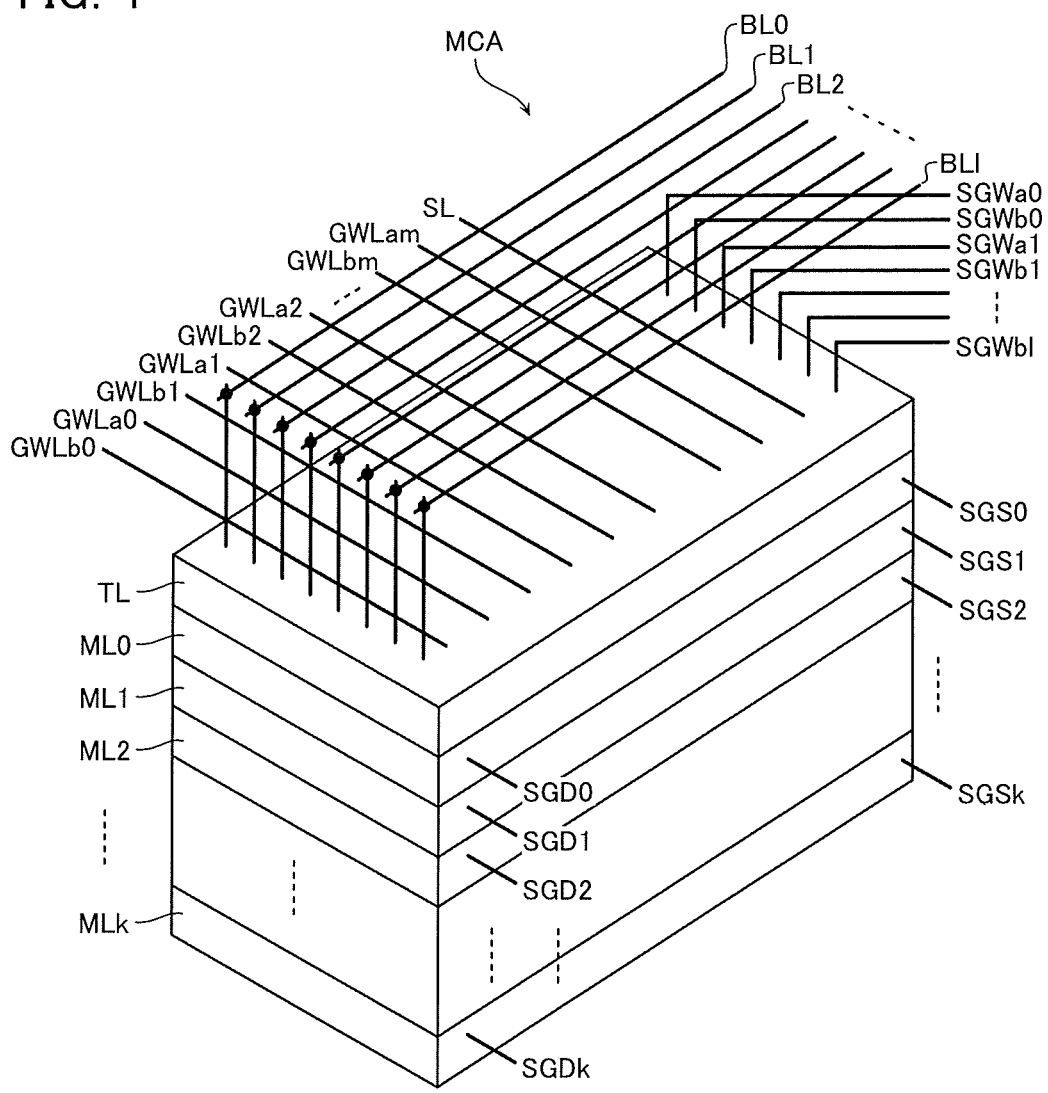
FIG. 1 is a schematic view of a semiconductor memory device according to a first embodiment.

A semiconductor memory device according to an embodiment includes: a substrate; a plurality of first semiconductor portions arranged in a first direction intersecting a surface of the substrate; a first gate electrode extending in the first direction, the first gate electrode facing the plurality of first semiconductor portions from a second direction intersecting the first direction; a first insulating portion provided between the first semiconductor portions and the first gate electrode; a first wiring separated from the first gate electrode in the first direction; a second semiconductor portion connected to one end in the first direction of the first gate electrode and to the first wiring; a second gate electrode facing the second semiconductor portion; and a second insulating portion provided between the second semiconductor portion and the second gate electrode.

Next, semiconductor memory devices according to embodiments will be described in detail with reference to the drawings. Note that these embodiments are merely examples, and are not shown with the intention of limiting the present invention.

Moreover, the drawings are each schematic, and part of a configuration, and soon, of the drawings is sometimes omitted. Moreover, portions that are common to each of the embodiments are assigned with common symbols, and descriptions thereof are sometimes omitted.

Moreover, in the present specification, a certain direction parallel to a surface of a substrate will be called an X direction, a direction parallel to the surface of the substrate and perpendicular to the X direction will be called a Y direction, and a direction perpendicular to the surface of the substrate will be called a Z direction.

Moreover, in the present specification, sometimes, a direction along a certain plane will be called a first direction, a direction intersecting the first direction along this certain plane will be called a second direction, and a direction intersecting this certain plane will be called a third direction. These first direction, second direction, and third direction may, but need not, each respectively correspond to any one of the X direction, the Y direction, and the Z direction.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end section on a substrate side of this configuration, and when an upper surface or an upper end is referred to for a certain configuration, this will be assumed to mean a surface or end section on an opposite side to the substrate of this configuration. Moreover, a surface intersecting the X direction or the Y direction will be called a side surface, and so on.

Moreover, in the present specification, when a "width" or a "thickness" in a certain direction is referred to for a configuration, a member, and so on, this will sometimes mean a width or a thickness in a cross section observed by the likes of SEM (Scanning Electron Microscopy) or TEM (Transmission Electron Microscopy), and so on.

First Embodiment

[Configuration]

FIG. 1 is a schematic view of a semiconductor memory device according to a first embodiment. The semiconductor memory device according to the present embodiment includes: a memory cell array MCA; and an unillustrated peripheral circuit that supplies a voltage to the memory cell array MCA. The memory cell array MCA includes: a plurality of memory layers ML0-MLk (where k is a natural number); and a transistor layer TL.

The plurality of memory layers ML0-MLk are respectively connected with drain select lines SGD0-SGDk and source select lines SGS0-SGSk. Moreover, the plurality of memory layers ML0-MLk are commonly connected with a plurality of bit lines BL0-BL1 (where 1 is a natural number) and a source line SL.

The transistor layer TL is connected with pluralities of global word lines GWLa0-GWLam, GWLb0-GWLbm (where m is a natural number). Moreover, the transistor layer TL is connected with pluralities of word line select lines SGWa0-SGWa1, SGWb0-SGWb1.

Figure 2:
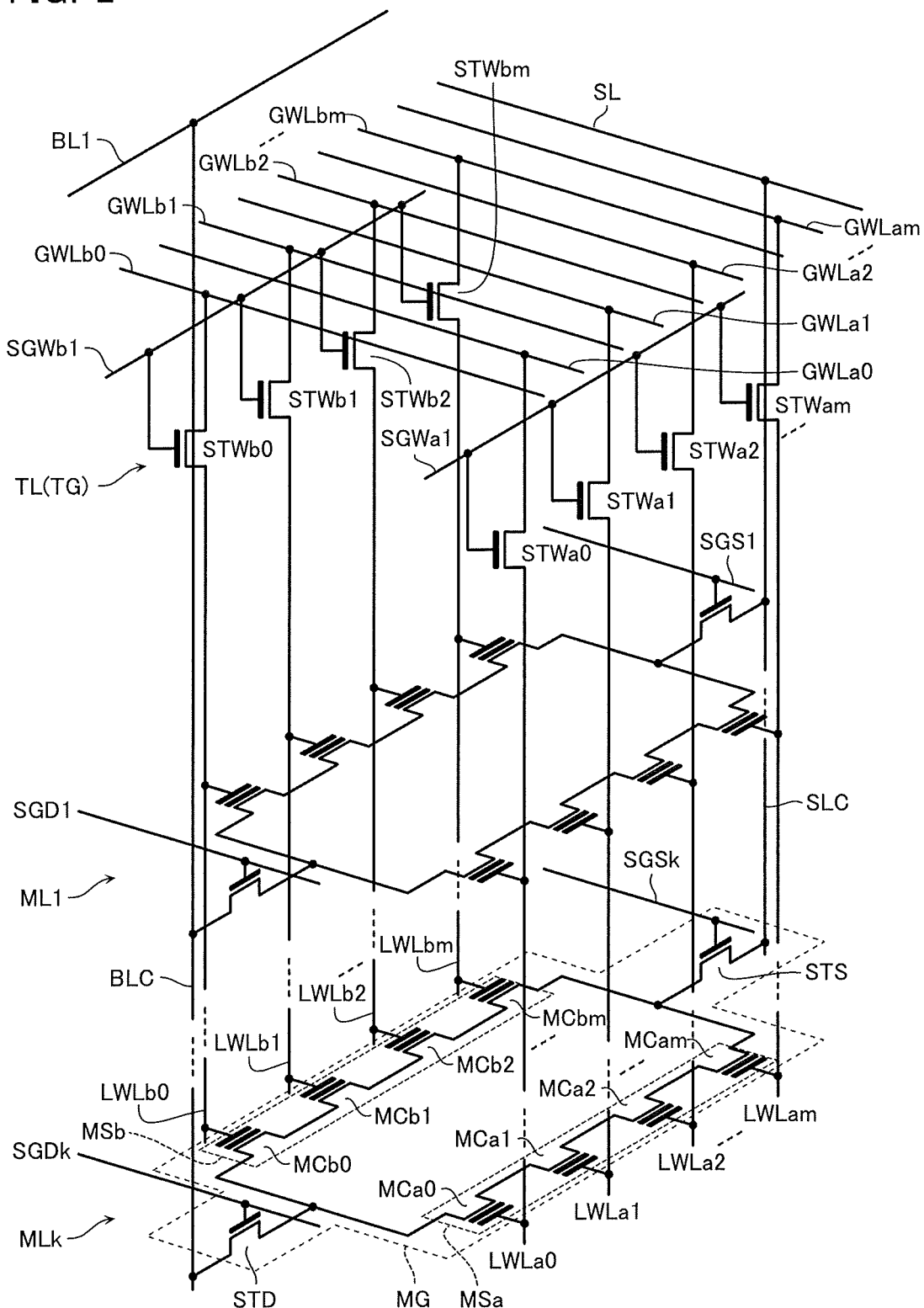
FIG. 2 is a schematic equivalent circuit diagram of same semiconductor memory device.

FIG. 2 is a schematic equivalent circuit diagram exemplifying a configuration connected between the bit line BL1 and the source line SL. Although FIG. 2 exemplifies the configuration connected between the bit line BL1 and the source line SL, a similar configuration is connected also between the other bit lines BL0, BL2-BL1 and the source line SL.

A plurality of memory groups MG corresponding to the memory layers ML0-MLk are connected in parallel between the bit line BL1 and the source line SL. Moreover, a transistor group TG corresponding to the transistor layer TL is commonly connected to these plurality of memory groups MG.

The memory group MG includes two memory strings MSa, MSb connected in parallel between the bit line BL1 and the source line SL. Moreover, the memory group MG includes: a drain select transistor STD provided between the memory strings MSa, MSb and the bit line BL1; and a source select transistor STS provided between the memory strings MSa, MSb and the source line SL.

The memory string MSa includes a plurality of memory cells MCa0-MCam connected in series. These plurality of memory cells MCa0-MCam are each a field effect type of transistor that includes: a semiconductor portion; a gate electrode facing this semiconductor portion; and a gate insulating film provided between these semiconductor portion and gate electrode. Electrical characteristics of the gate insulating film change according to a write operation and an erase operation, and, consequently, a threshold voltage of the memory cells MCa0-MCam also changes. The memory cells MCa0-MCam are each thereby capable of storing one bit or multiple bits of data. Local word lines LWLa0-LWLam are respectively connected to the gate electrodes of the memory cells MCa0-MCam. These plurality of local word lines LWLa0-LWLam are respectively commonly connected to the gate electrodes of the plurality of memory cells MCa0-MCam included in each of the memory layers ML0-MLk.

The memory string MSb includes a plurality of memory cells MCb0-MCbm connected in series. These plurality of memory cells MCb0-MCbm are configured similarly to the memory cells MCa0-MCam. Local word lines LWLb0-LWLbm are respectively connected to the gate electrodes of the memory cells MCb0-MCbm. These plurality of local word lines LWLb0-LWLbm are respectively commonly connected to the gate electrodes of the plurality of memory cells MCb0-MCbm included in each of the memory layers ML0-MLk.

The drain select transistor STD includes a gate electrode connected with any one of the drain select lines SGD0-SGDk. Note that the drain select line SGDz (where z is an integer between 0 and k) is commonly connected to each of the gate electrodes of the plurality of drain select transistors STD included in the same memory layer MLz.

The source select transistor STS includes a gate electrode connected with any one of the source select lines SGS0-SGSk. Note that the source select line SGSz is commonly connected to each of the gate electrodes of the plurality of source select transistors STS included in the same memory layer MLz.

The transistor group TG includes a plurality of word line select transistors STWa0-STWam respectively connected between the plurality of local word lines LWLa0-LWLam and global word lines GWLa0-GWLam. The word line select lines SGWa0-SGWa1 are commonly connected to gate electrodes of these word line select transistors STWa0-STWam. Moreover, the transistor group TG includes a plurality of word line select transistors STWb0-STWbm respectively connected between the plurality of local word lines LWLb0-LWLbm and global word lines GWLb0-GWLbm. The word line select lines SGWb0-SGWb1 are commonly connected to gate electrodes of these word line select transistors STWb0-STWbm.

Next, a configuration example of the semiconductor memory device according to the present embodiment will be described with reference to FIGS. 3-10.

Figure 3:
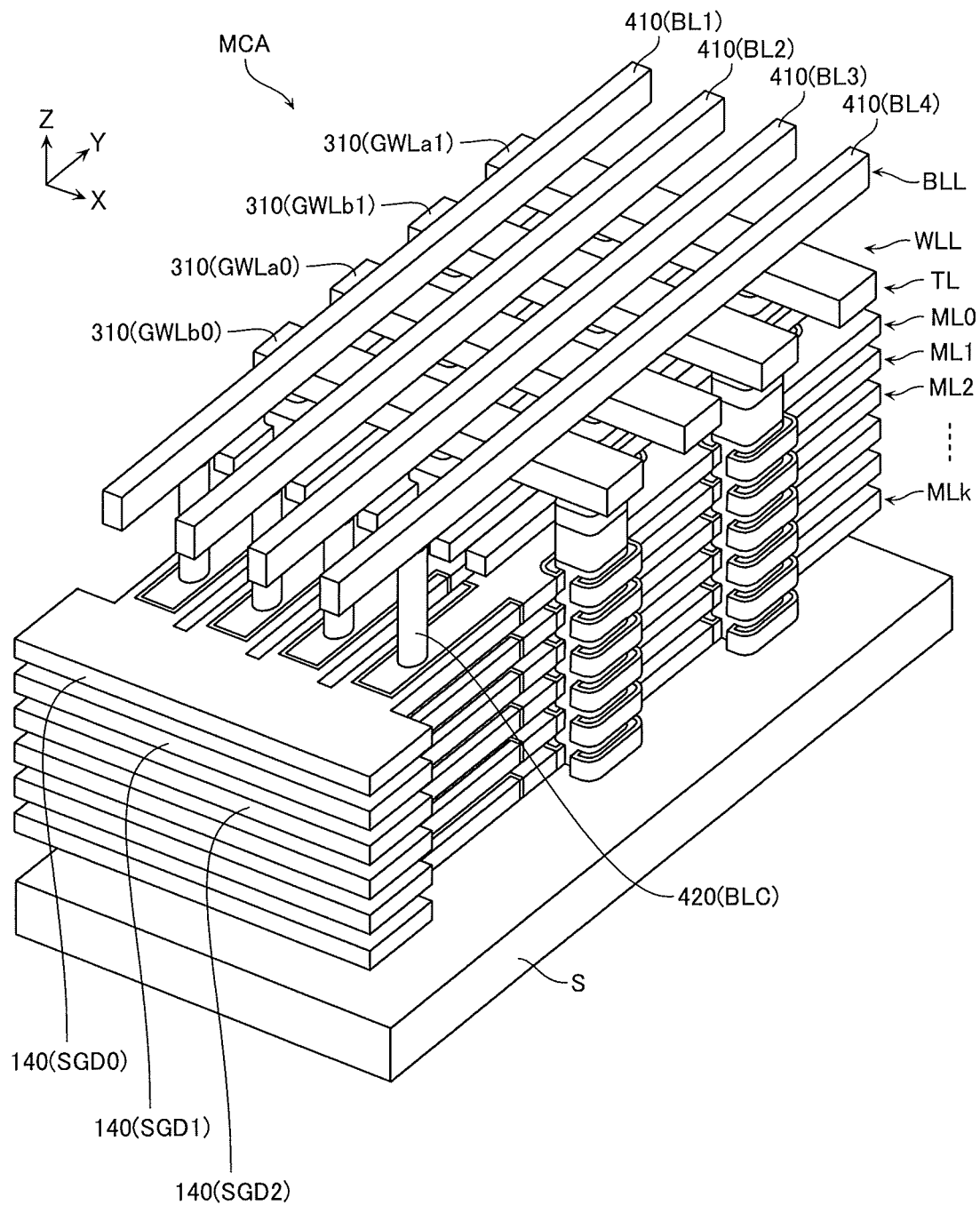
FIG. 3 is a schematic perspective view showing a configuration example of same semiconductor memory device.
Figure 4:
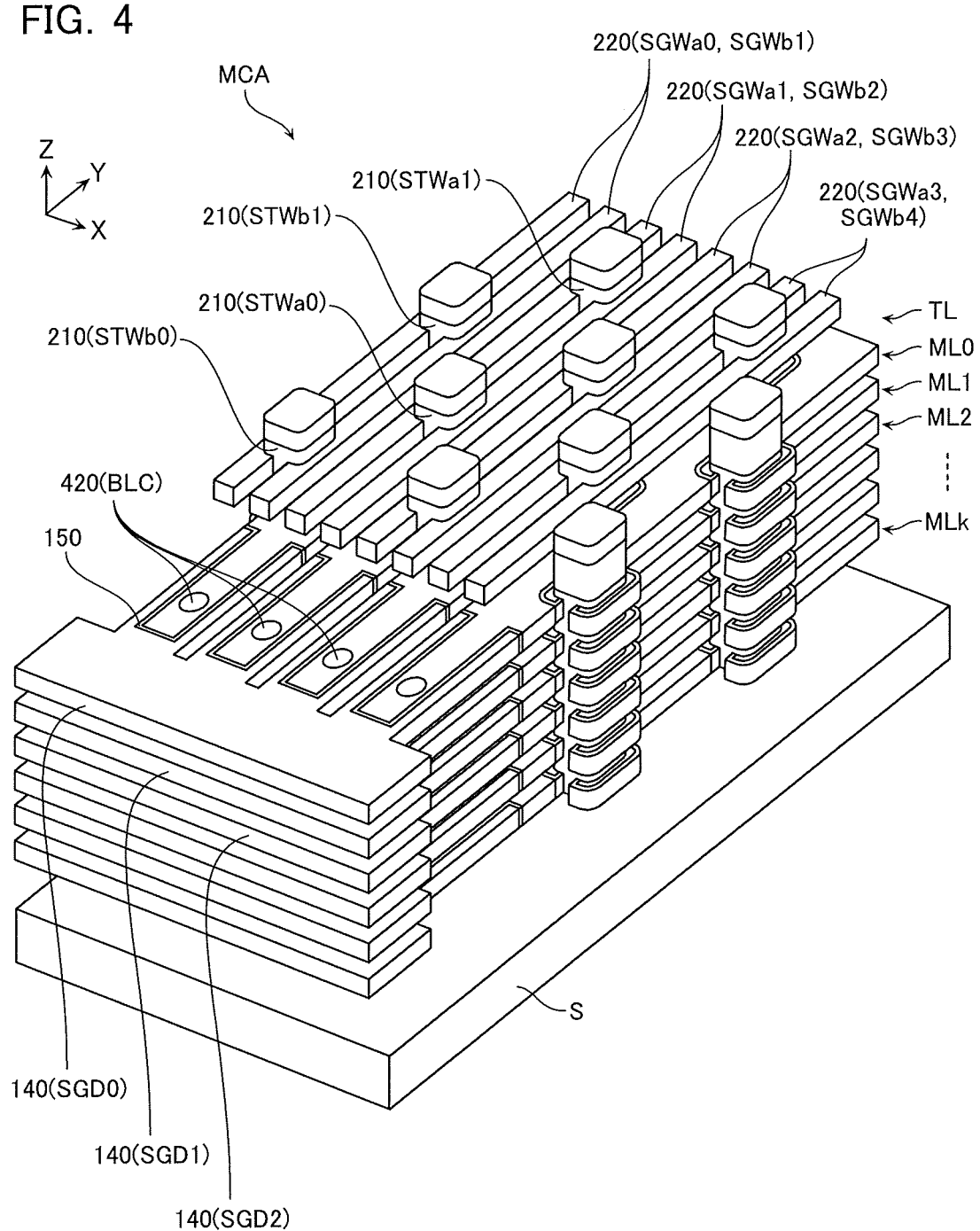
FIG. 4 is a schematic perspective view showing same configuration example.
Figure 5:
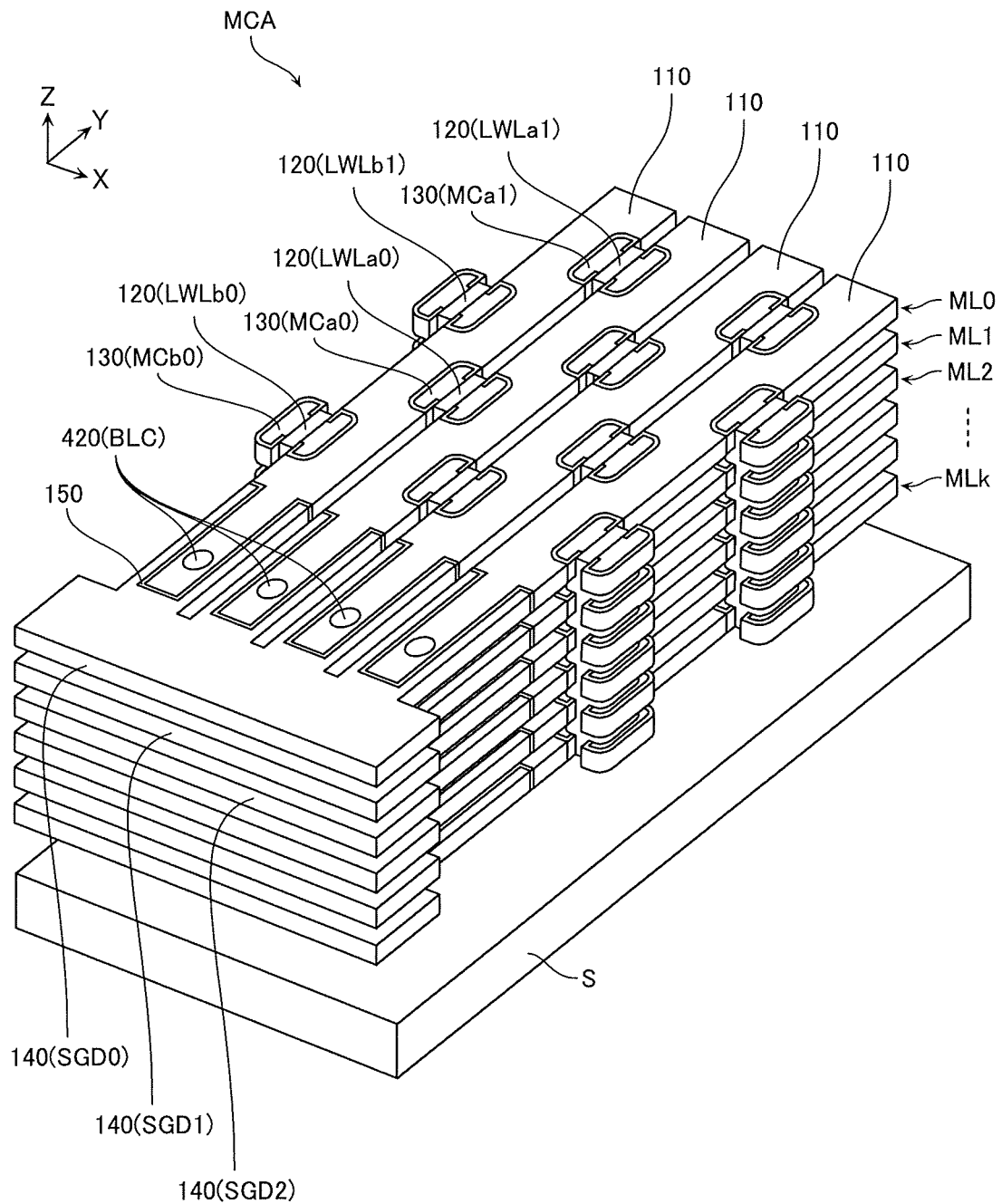
FIG. 5 is a schematic perspective view showing same configuration example.

FIG. 3 is a schematic perspective view for describing the configuration example of the semiconductor memory device according to the present embodiment. FIG. 4 is a schematic perspective view in which a bit line layer BLL where the bit lines BL0-BL1 are provided and a word line layer WLL where the global word lines GWLa0-GWLam, GWLb0-GWLbm are provided, have been omitted from the structure shown in FIG. 3. FIG. 5 is a schematic perspective view in which the transistor layer TL has been omitted from the structure shown in FIG. 4. Note that in FIG. 4, some of a plurality of conductive portions 220 have been omitted. The same applies also to FIG. 3.

Figure 6:
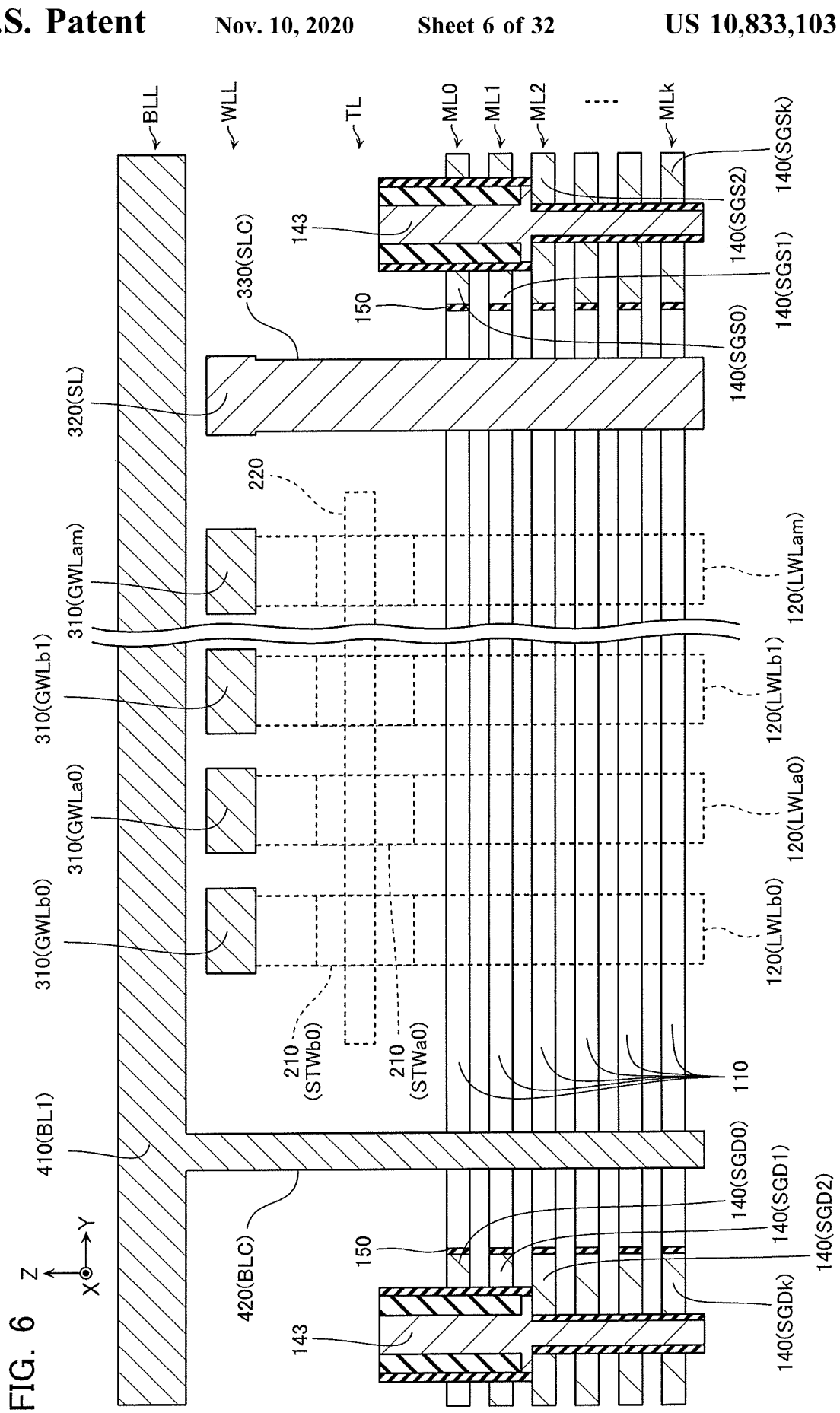
FIG. 6 is a schematic YZ cross-sectional view showing same configuration example.
Figure 7:
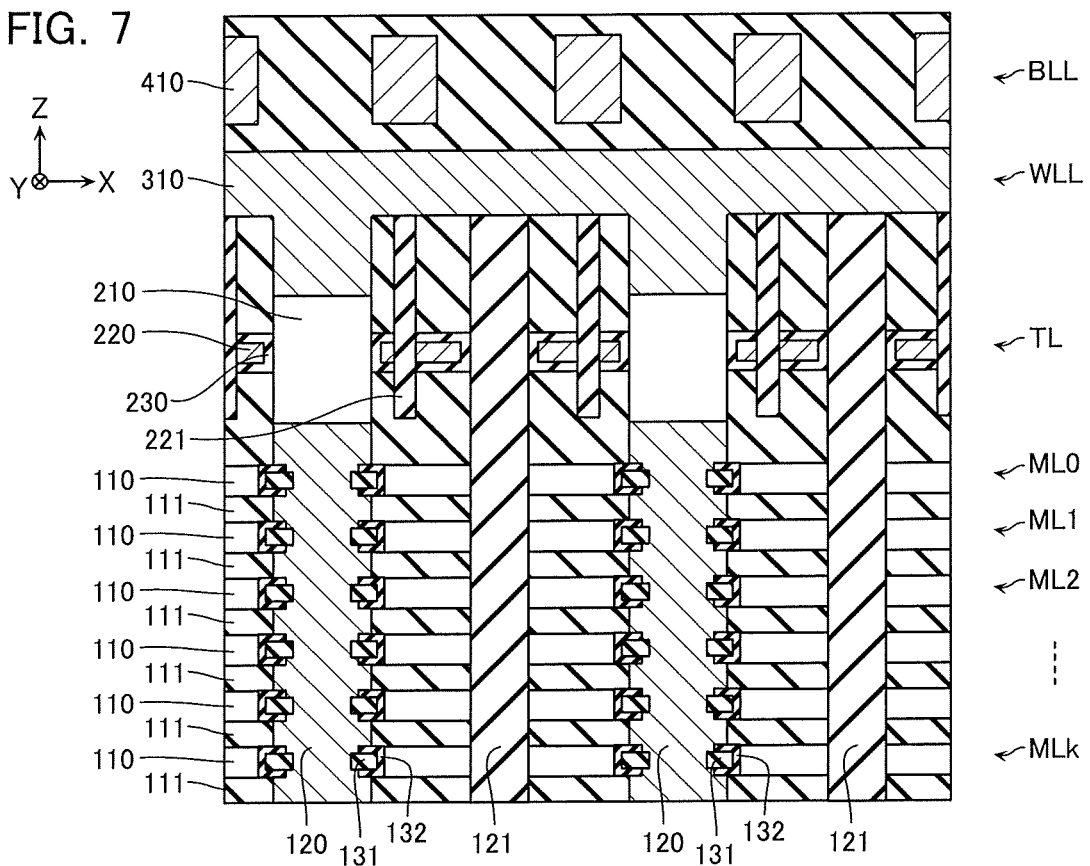
FIG. 7 is a schematic XZ cross-sectional view showing same configuration example.

FIG. 6 is a schematic YZ cross-sectional view for describing same configuration example. The configuration indicated by the dotted line in FIG. 6 shows schematically a configuration appearing in a different cross section to the cross section shown in FIG. 6. FIG. 7 is a schematic XZ cross-sectional view for describing same configuration example.

Figure 8:
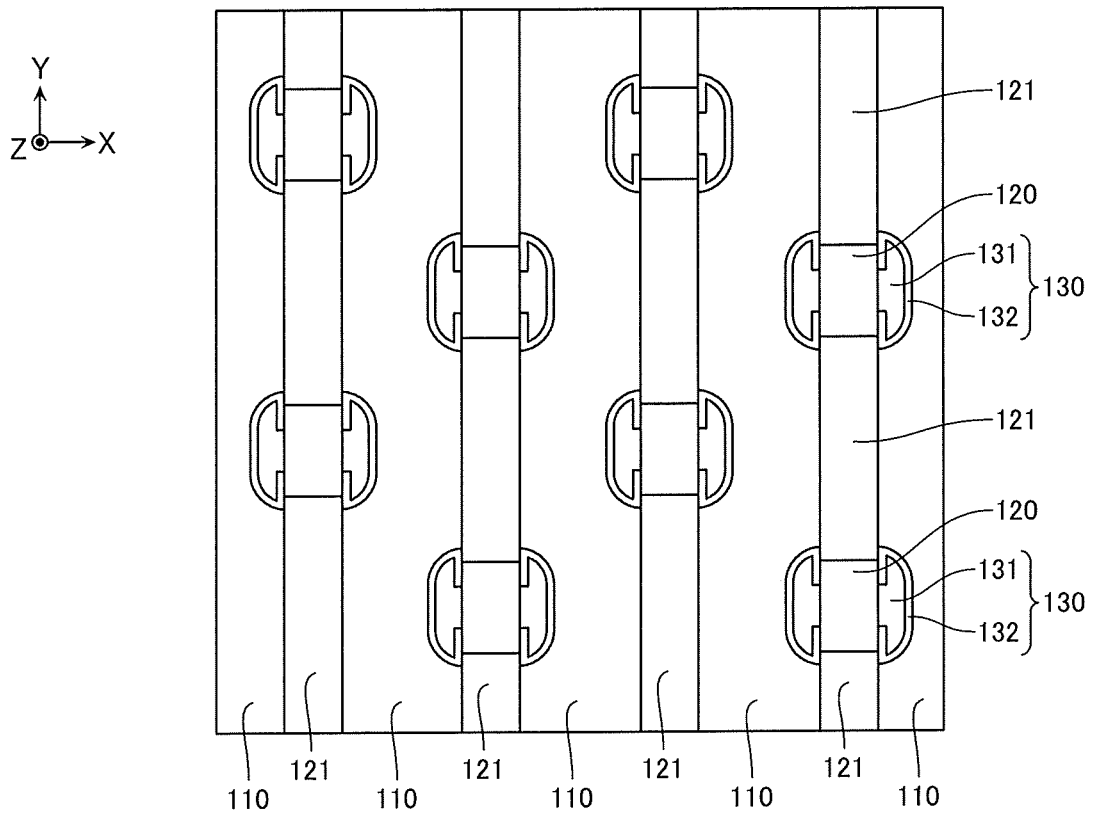
FIG. 8 is a schematic XY cross-sectional view showing same configuration example.
Figure 9:
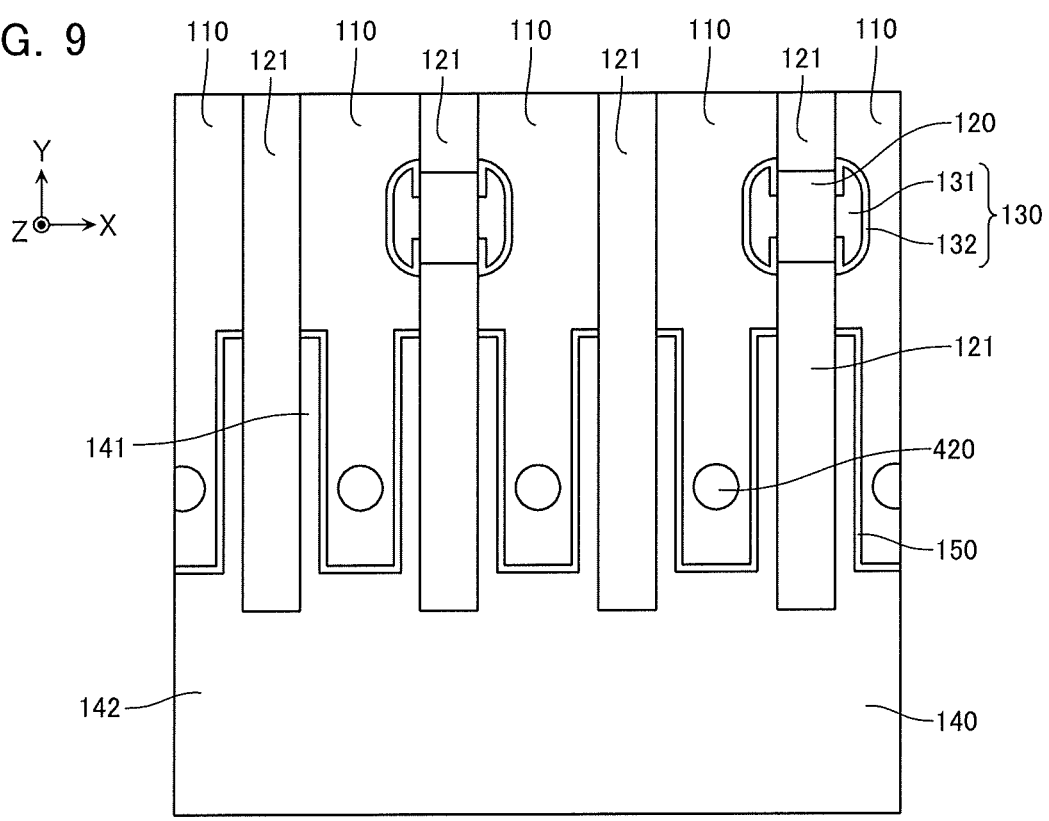
FIG. 9 is a schematic XY cross-sectional view showing same configuration example.
Figure 10:
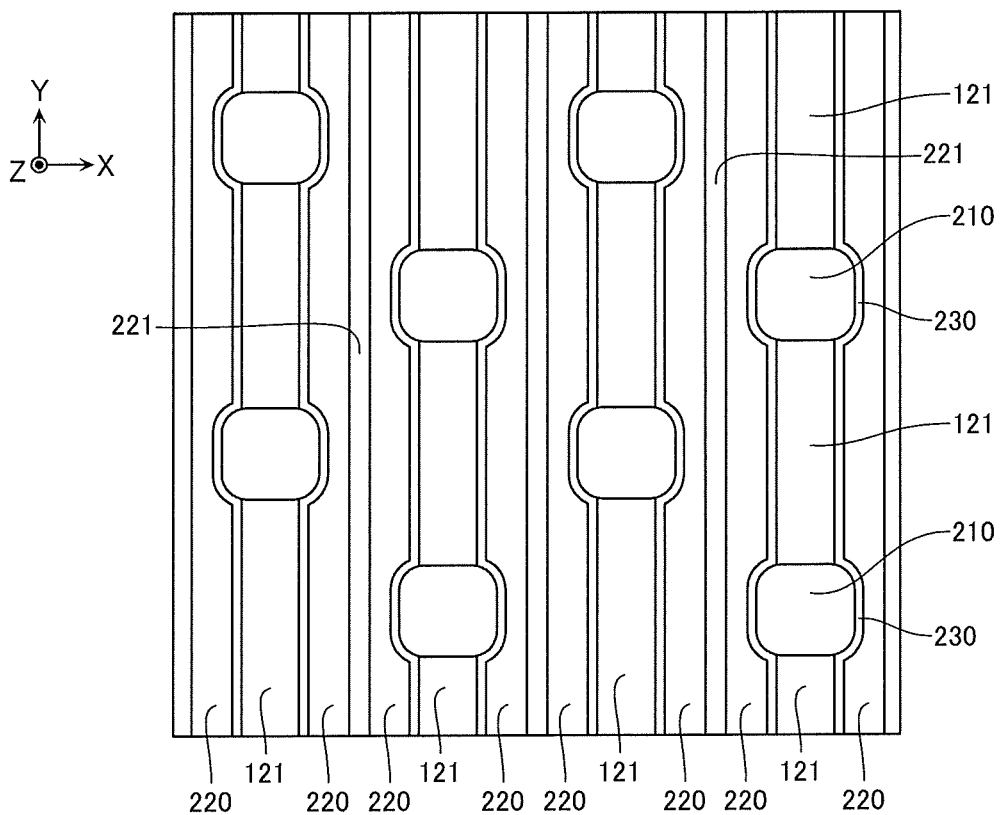
FIG. 10 is a schematic XY cross-sectional view showing same configuration example.

FIGS. 8 and 9 are schematic XY cross-sectional views showing configurations of parts of the memory layers ML0-MLk. FIG. 10 is a schematic XY cross-sectional view corresponding to a configuration of part of the transistor layer TL.

As shown in FIG. 3, the semiconductor memory device according to the present embodiment includes: a substrate S; and part of the memory cell array MCA provided above the substrate S. The memory cell array MCA includes: the plurality of memory layers ML0-MLk arranged in the Z direction; the transistor layer TL provided above the memory layers ML0-MLk; the word line layer WLL provided above the transistor layer TL; and the bit line layer BLL provided above the word line layer WLL. These configurations will be described in order below.

First, the memory layers ML0-MLk will be described. As shown in FIG. 5, the memory layers ML0-MLk each include: a plurality of semiconductor portions 110 that are arranged in the X direction and extend in the Y direction; parts of a plurality of conductive portions 120 that are arranged in the Y direction between these plurality of semiconductor portions 110; and a gate insulating film 130 that is provided between the semiconductor portion 110 and the conductive portion 120. In addition, the memory layers ML0-MLk each include: a conductive portion 140 that faces end sections in the Y direction of the plurality of semiconductor portions 110 aligned in the X direction; and a gate insulating film 150 that is provided between the semiconductor portion 110 and the conductive portion 140.

The semiconductor portion 110 includes the likes of polycrystalline silicon (Si), for example. A side surface on one side in the X direction of the semiconductor portion 110 faces a plurality of the conductive portions 120, and functions as channel regions of the memory cells MCa0-MCam. A side surface on the other side in the X direction of the semiconductor portion 110 faces a plurality of the conductive portions 120, and functions as channel regions of the memory cells MCb0-MCbm. Both side surfaces in the X direction and a side surface in the Y direction of one end section in the Y direction of the semiconductor portion 110 faces the conductive portion 140, and function as a channel region of the drain select transistor STD. Moreover, as shown in FIG. 6, the other end section in the Y direction of the semiconductor portion 110 also faces the conductive portion 140, and functions as a channel region of the source select transistor STS. Note that the one end section and the other end section of the semiconductor portion 110 are respectively connected to a conductive portion 420 and a conductive portion 330.

The conductive portion 120 includes the likes of a laminated structure of titanium nitride (TiN) and tungsten (W), for example. As shown in FIG. 8, the conductive portion 120 has a substantially rectangular columnar shape, for example. Note that, in the illustrated example in FIG. 7, the conductive portion 120 includes first portions included in the memory layers ML0-MLk and second portions not included in the memory layers ML0-MLk. Additionally, a width in the X direction of the first portion is smaller than a width in the X direction of the second portion. As shown in FIG. 8, an insulating portion 121 of silicon oxide ($SiO_2$), or the like, is provided between two conductive portions 120 aligned in the Y direction. As shown in FIG. 7, the conductive portion 120 extends in the Z direction, and functions as the local word line LWLay or the local word line LWLby (where y is an integer between 0 and m). Moreover, for example, a conductive portion 120 corresponding to the local word line LWLay includes a side surface on one side in the X direction, and the side surface faces side surfaces of the semiconductor portions 110 included in the memory layers ML0-MLk, and functions as the gate electrodes of the memory cells MCa0-MCam connected to the bit line BLx. Moreover, the conductive portion 120 includes a side surface on the other side in the X direction, and the side surface faces side surfaces of the semiconductor portions 110 included in the memory layers ML0-MLk, and functions as the gate electrodes of the memory cells MCa0-MCam connected to the bit line BLx−1. Similarly, a conductive portion 120 corresponding to the local word line LWLby includes side surfaces in the X direction, and the side surfaces face side surfaces of the semiconductor portions 110 included in the memory layers ML0-MLk, and functions as the gate electrodes of the memory cells MCb0-MCbm connected to the bit line BLx and the bit line BLx+1.

Note that the conductive portions 120 corresponding to the local word lines LWLa0-LWLam are arranged in the X direction and the Y direction in a matrix manner. Additionally, the conductive portions 120 corresponding to the local word lines LWLb0-LWLbm are arranged in the X direction and the Y direction in a matrix manner. Moreover, positions in the Y direction of the conductive portions 120 corresponding to the local word lines LWLa0-LWLam are different from positions in the Y direction of the conductive portions 120 corresponding to the local word lines LWLb0-

LWLbm. For example, as exemplified in FIG. 5, a position (for example, a center position or center of gravity in XY cross-sectional view) in the Y direction of a conductive portion 120 corresponding to the local word line LWLa0 is between positions in the Y direction of conductive portions 120 corresponding to the local word line LWLb0 and the local word line LWLb1.

As shown in FIG. 8, the gate insulating film 130 includes: a ferroelectric portion 131; and an insulating film 132 of silicon oxide, or the like. The ferroelectric portion 131 is the likes of a film containing hafnium (Hf) and oxygen (O) as main components and including at least one of silicon (Si), scandium (Sc), yttrium (Y), titanium (Ti), vanadium (V), niobium (Nb), tantalum (Ta), zirconium (Zr), aluminum (Al), strontium (Sr), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) as an additive, for example. The ferroelectric portion 131 includes $Hf_{1-x}M_xO_{2-y}$ (where M is any one of the above-described additives, x is larger than 0 and smaller than 1, and y is larger than 0 and smaller than 2), for example.

The conductive portion 140 (FIG. 9) includes the likes of a laminated structure of titanium nitride (TiN) and tungsten (W), for example. As shown in FIG. 9, for example, the conductive portion 140 has a substantially comb-like shape. That is, the conductive portion 140 includes: a plurality of first portions 141 that are arranged in the X direction and extend in the Y direction; and a second portion 142 that extends in the X direction and is connected to the plurality of first portions 141. The plurality of first portions 141 each face a side surface in the X direction of the one end section or the other end section of the semiconductor portion 110, and each function as the gate electrode of the drain select transistor STD or the source select transistor STS. The second portion 142 functions as the drain select line SGDz or the source select line SGSz. Note that, as exemplified in FIG. 6, contacts 143 are respectively connected to the conductive portions 140 disposed in each of the memory layers ML0-MLk.

The gate insulating film 150 includes the likes of silicon oxide, for example.

Next, the transistor layer TL will be described. As shown in FIG. 4, the transistor layer TL includes: a plurality of semiconductor portions 210 that are arranged in the X direction and the Y direction correspondingly to the conductive portions 120 (FIG. 5); and a plurality of the conductive portions 220 that are arranged in the X direction, extend in the Y direction, and face side surfaces on one side or the other side of the plurality of semiconductor portions 210. In addition, as shown in FIG. 10, the transistor layer TL includes a gate insulating film 230 that is provided between the semiconductor portion 210 and the conductive portion 220.

The semiconductor portion 210 includes the likes of polycrystalline silicon (Si), for example. Both side surfaces in the X direction of the semiconductor portion 210 face the conductive portions 220, and function as channel regions of the word line select transistors STWay, STWby. The insulating portion 121 is provided between two semiconductor portions 210 aligned in the Y direction. As shown in FIG. 7, the semiconductor portions 210 are provided corresponding to the conductive portion 120, and lower ends of the semiconductor portions 210 are connected to the conductive portions 120. Therefore, as shown in FIG. 10, positions in the Y direction of the semiconductor portions 210 connected to the conductive portions 120 corresponding to the local word lines LWLa0-LWLam are different from positions in the Y direction of the semiconductor portions 210 connected to the conductive portions 120 corresponding to the local word lines LWLb0-LWLbm.

The conductive portion 220 includes the likes of a laminated structure of titanium nitride (TiN) and tungsten (W), for example. As shown in FIG. 10, the conductive portion 220 extends in the Y direction, and functions as the word line select lines SGWax, SGWbx (where x is an integer between 0 and 1). Moreover, the conductive portion 220 faces side surfaces in the X direction of a plurality of the semiconductor portions 210 arranged in the Y direction, and functions as the gate electrodes of the word line select transistors STWa0-STWam, STWb0-STWbm. An insulating portion 221 of silicon oxide, or the like, is provided between two conductive portions 220 aligned in the X direction.

The gate insulating film 230 includes the likes of silicon oxide, for example. As shown in FIG. 7, the gate insulating film 230 according to the present embodiment covers an upper surface and lower surface, and aside surface in the X direction, of the conductive portion 220. However, a specific configuration of the gate insulating film 230 may be appropriately changed, and it need not cover the upper surface and the lower surface of the conductive portion 220.

Next, the word line layer WLL will be described. As shown in FIG. 6, the word line layer WLL includes a plurality of conductive portions 310 and a conductive portion 320 that are aligned in the Y direction.

The conductive portion 310 includes the likes of a laminated structure of titanium nitride (TiN) and tungsten (W), for example. As shown in FIG. 7, for example, the conductive portion 310 extends in the X direction, and is commonly connected to upper ends of a plurality of the semiconductor portions 210 aligned in the X direction. The conductive portions 310 respectively function as the global word lines GWLay, GWLby.

The conductive portion 320 (FIG. 6) includes the likes of a laminated structure of titanium nitride (TiN) and tungsten (W), for example. As shown in FIG. 6, for example, the conductive portion 320 is commonly connected to the semiconductor portions 110 of the memory layers ML0-MLk, via the conductive portion 330 extending in the Z direction. The conductive portion 320 functions as the source line SL. The conductive portion 330 functions as a source line contact SLC.

Next, the bit line layer BLL will be described. As shown in FIG. 3, for example, the bit line layer BLL includes a plurality of conductive portions 410 that are aligned in the X direction and extend in the Y direction.

The conductive portion 410 includes the likes of a laminated structure of titanium nitride (TiN) and tungsten (W), for example. As shown in FIG. 6, the conductive portion 410 is commonly connected to the semiconductor portions 110 of the memory layers ML0-MLk, via the conductive portion 420 extending in the Z direction. The conductive portion 410 functions as the bit line BLx. The conductive portion 420 functions as a bit line contact BLC.

[Manufacturing Method]

Next, a manufacturing method of the configuration described with reference to FIGS. 3-10 will be exemplified with reference to FIGS. 11-39. FIGS. 11, 15, 19, 21, 23, 25, 27, and 29-33 are XZ cross-sectional views corresponding to FIG. 7. FIGS. 12, 13, 34, and 35 are YZ cross-sectional views corresponding to FIG. 6. FIGS. 14, 18, 20, 22, 24, 26, and 28 are XY cross-sectional views corresponding to FIG. 8. FIGS. 16, 17, and 36-39 are XY cross-sectional views corresponding to FIG. 9.

Figure 11:
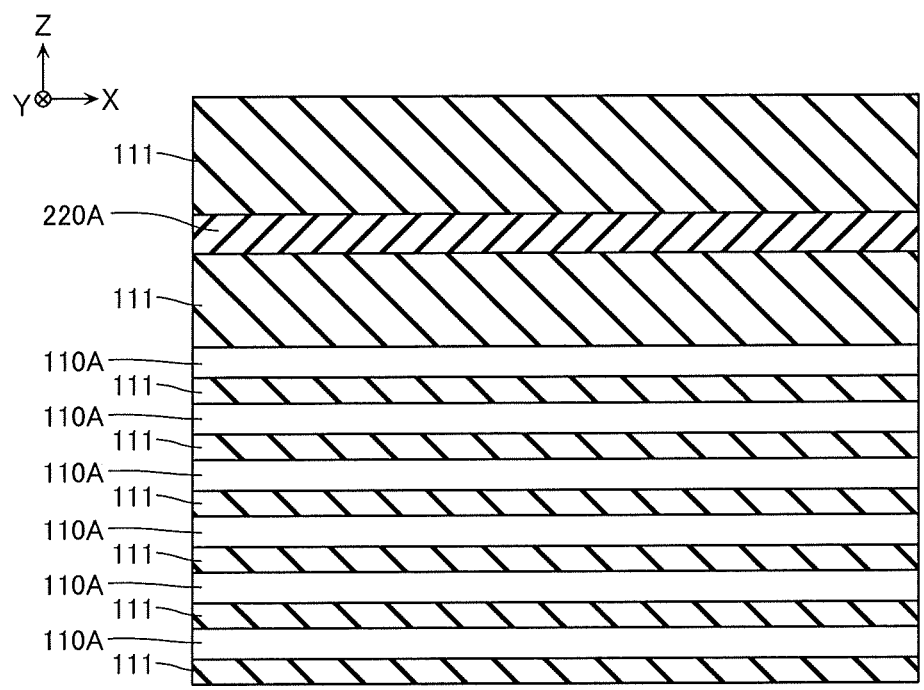
FIG. 11 is a schematic cross-sectional view showing a manufacturing method of same configuration example.

In same manufacturing method, as exemplified in FIG. 11, for example, a plurality of semiconductor portions 110A and the insulating portions 111 are alternately formed above the substrate S (FIG. 3). In addition, the insulating portion 111, a sacrifice film 220A of the likes of silicon nitride ($Si_3N_4$), and the insulating portion 111 are formed on an upper surface of this structure. This step is performed by a method such as CVD (Chemical Vapor Deposition), for example.

Figure 12:
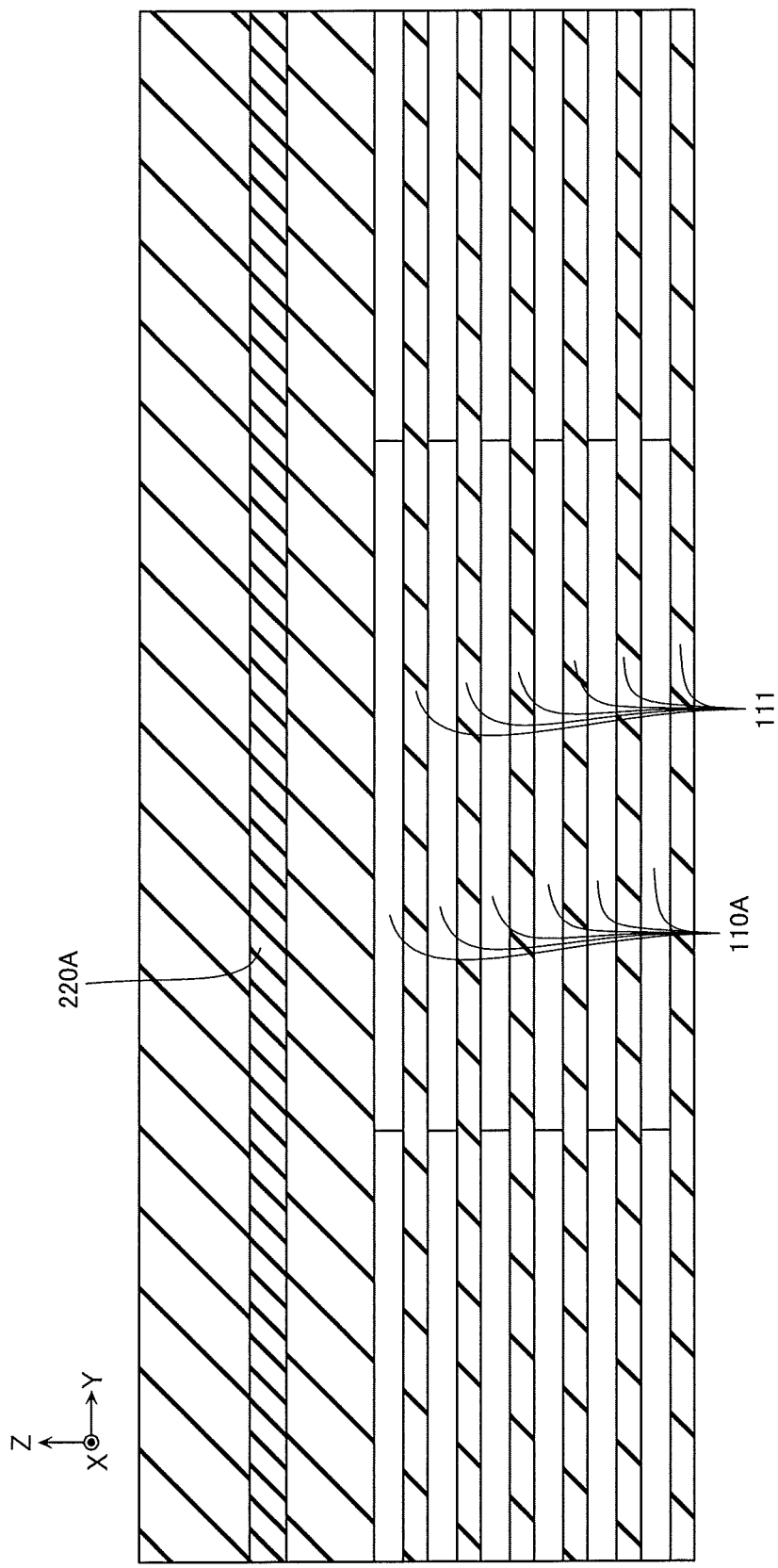
FIG. 12 is a schematic cross-sectional view showing same manufacturing method.

Next, an unillustrated via hole is formed in the structure exemplified in FIG. 11, and, as exemplified in FIG. 12, parts of the semiconductor portions 110A are selectively removed via this via hole. Formation of the via hole is performed by a method such as RIE (Reactive Ion Etching), for example. Removal of the semiconductor portion 110A is performed by a method such as wet etching, for example.

Figure 13:
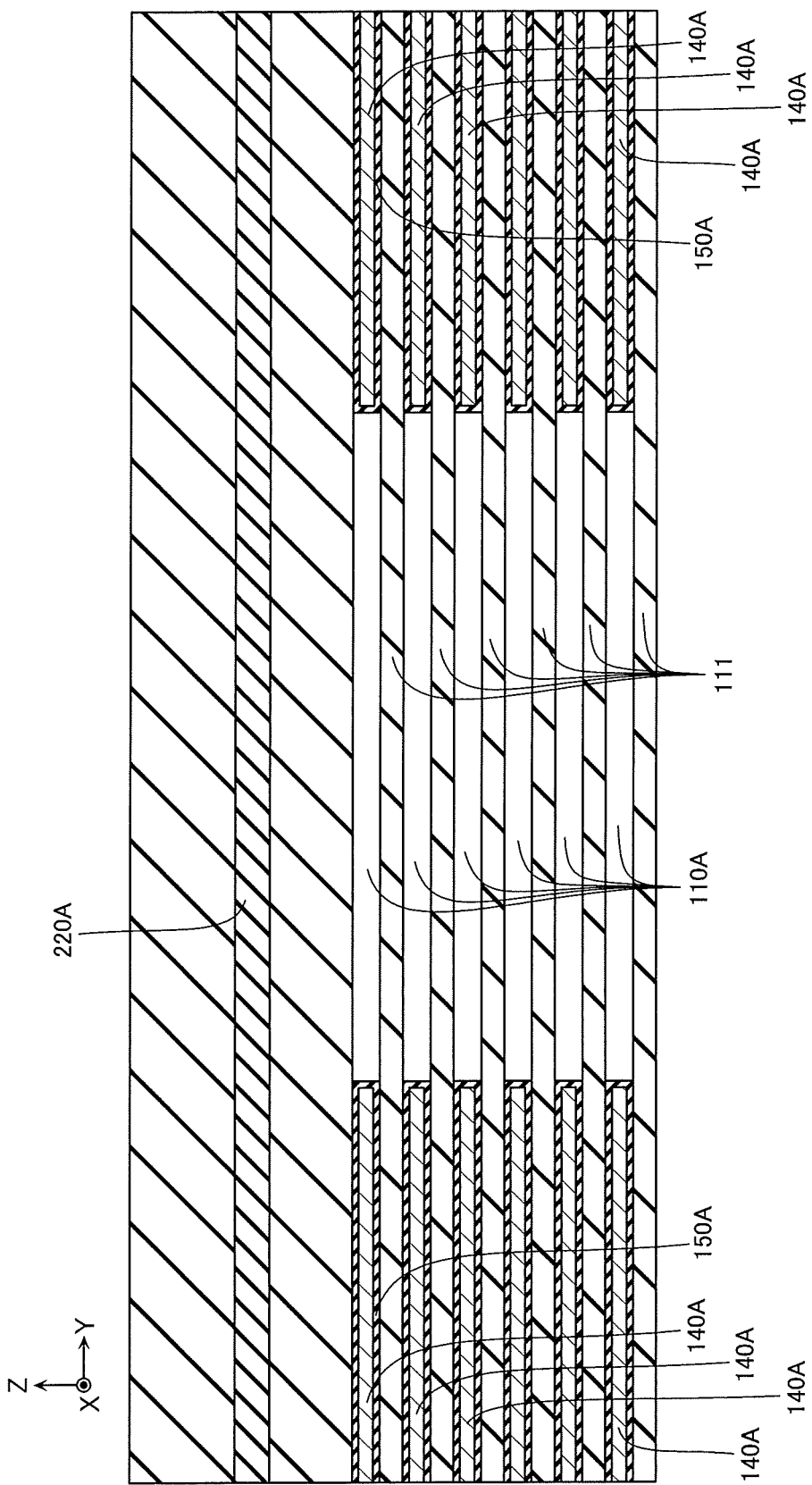
FIG. 13 is a schematic cross-sectional view showing same manufacturing method.

Next, as exemplified in FIG. 13, for example, an insulating portion 150A of the likes of silicon oxide, and a conductive portion 140A of the likes of titanium nitride and tungsten, are formed on an upper surface and lower surface of the insulating portion 111, and on a side surface of the semiconductor portion 110A, via the above-described via hole. This step is performed by a method of CVD, for example.

Figure 14:
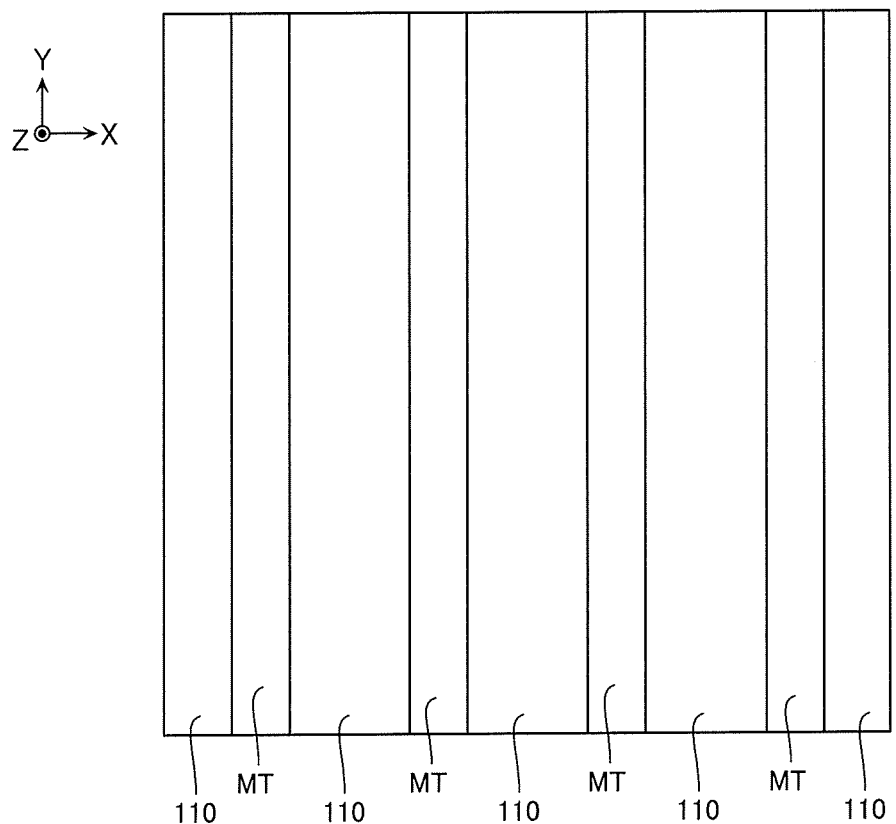
FIG. 14 is a schematic cross-sectional view showing same manufacturing method.
Figure 15:
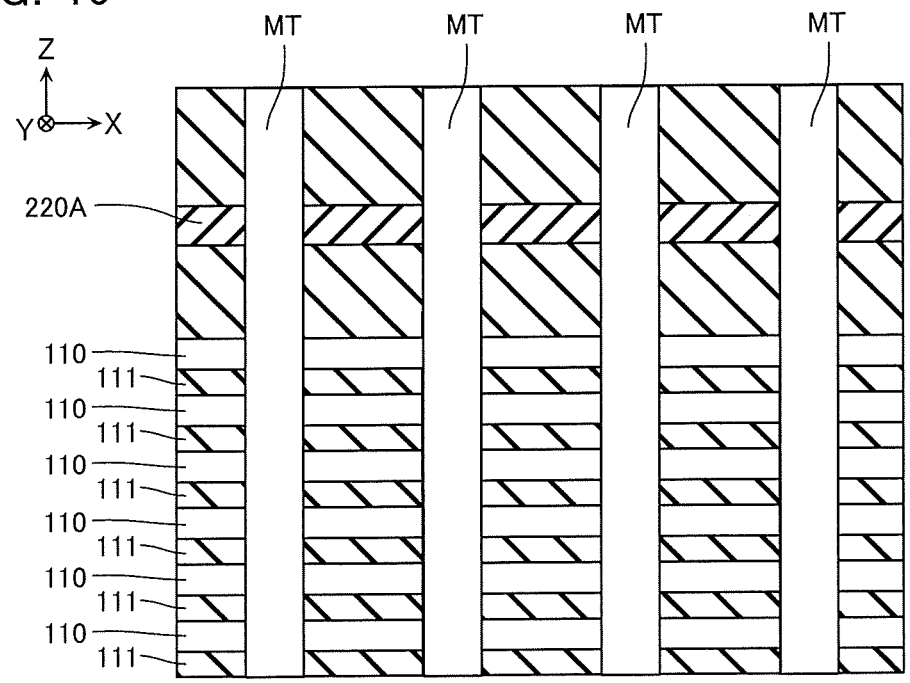
FIG. 15 is a schematic cross-sectional view showing same manufacturing method.

Next, as exemplified in FIGS. 14 and 15, for example, a plurality of memory trenches MT are formed in the structure exemplified in FIG. 13. The memory trenches MT are arranged in the X direction and extend in the Z direction and the Y direction. As a result, the plurality of semiconductor portions 110A laminated in the Z direction are divided in the X direction, and a plurality of the semiconductor portions 110 are formed.

Figure 16:
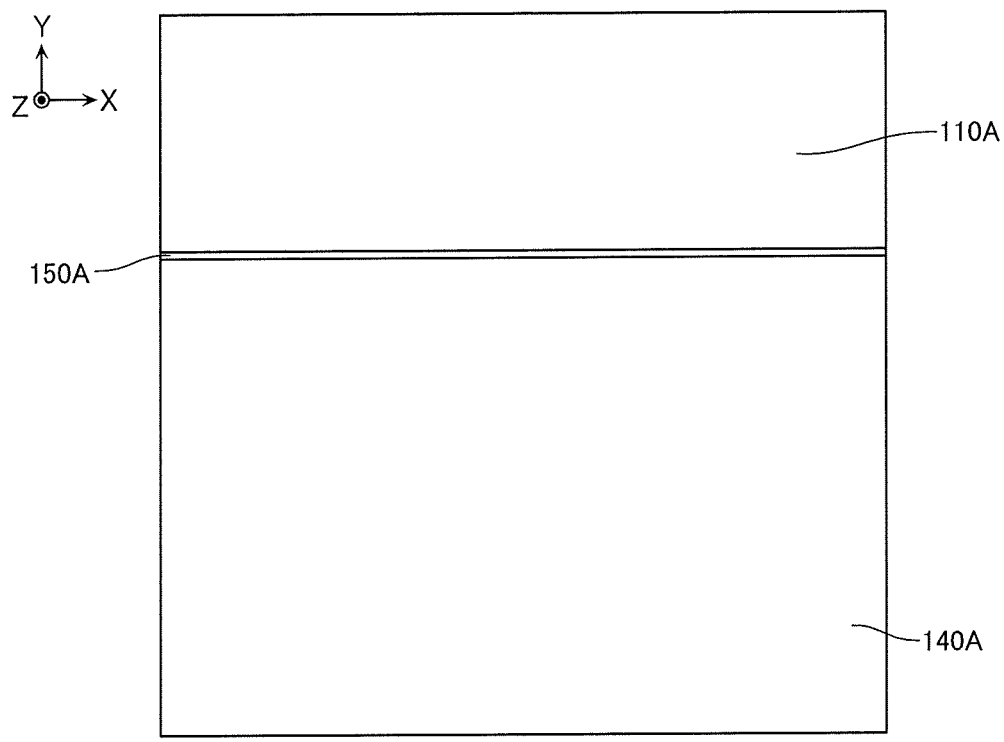
FIG. 16 is a schematic cross-sectional view showing same manufacturing method.
Figure 17:
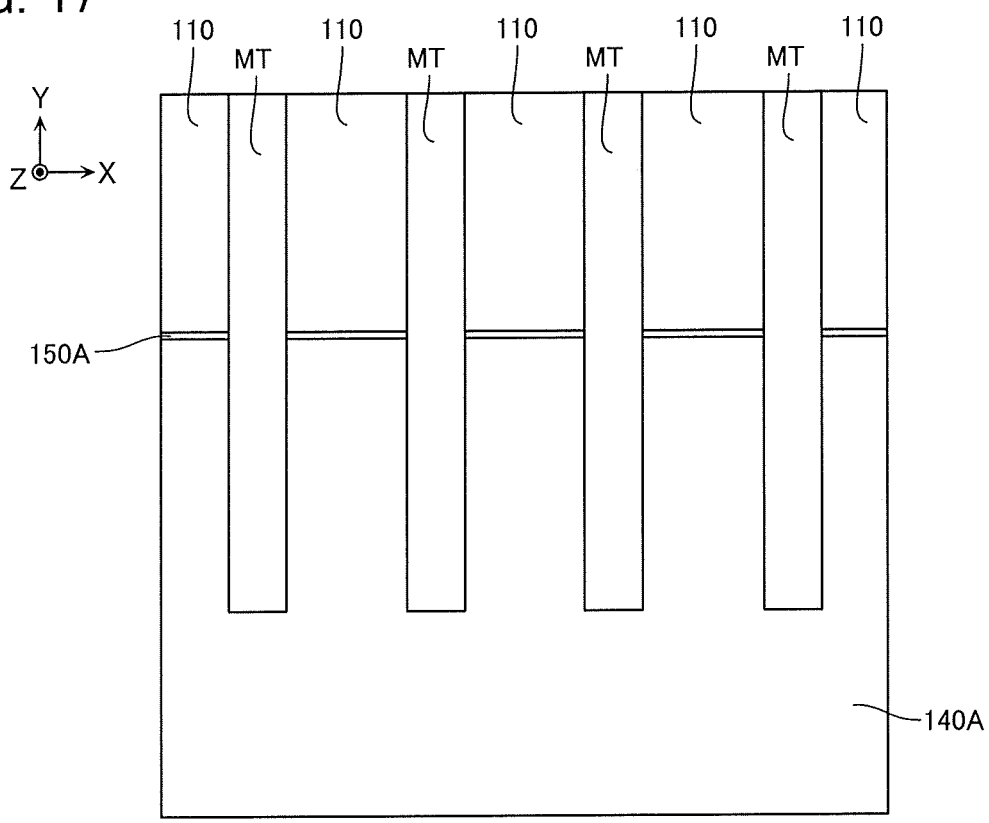
FIG. 17 is a schematic cross-sectional view showing same manufacturing method.

Note that, as exemplified in FIGS. 16 and 17, for example, end sections in the Y direction of the memory trenches MT reach the conductive portion 140A. Hence, when the memory trenches MT are formed, the conductive portion 140A is formed in substantially a comb shape.

Figure 18:
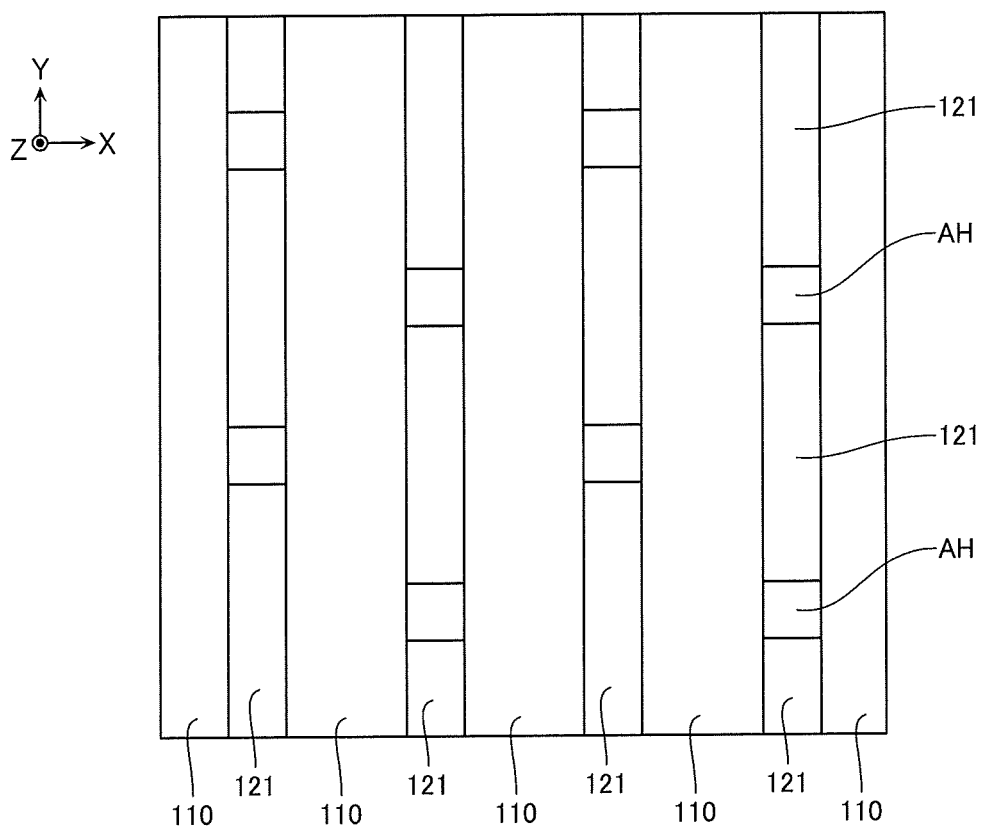
FIG. 18 is a schematic cross-sectional view showing same manufacturing method.
Figure 19:
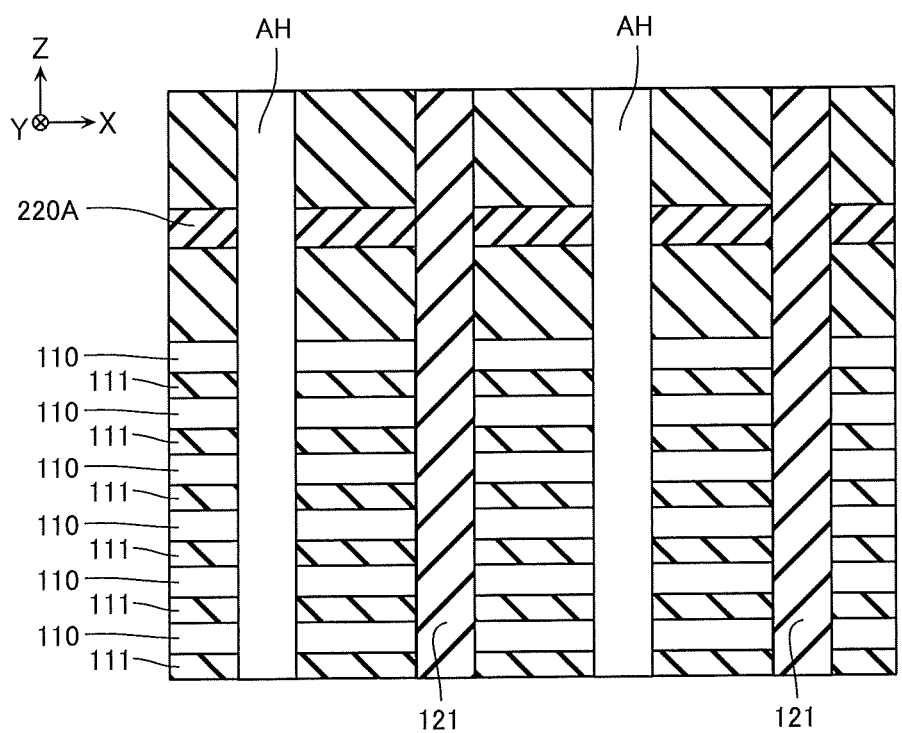
FIG. 19 is a schematic cross-sectional view showing same manufacturing method.

Next, as exemplified in FIGS. 18 and 19, for example, the insulating portion 121 is formed in the memory trench MT. In addition, a hole AH that extends in the Z direction and penetrates the insulating portion 121, is formed. Formation of the insulating portion 121 is performed by a method such as CVD, for example. Formation of the hole AH is performed by a method such as RIE, for example.

Figure 20:
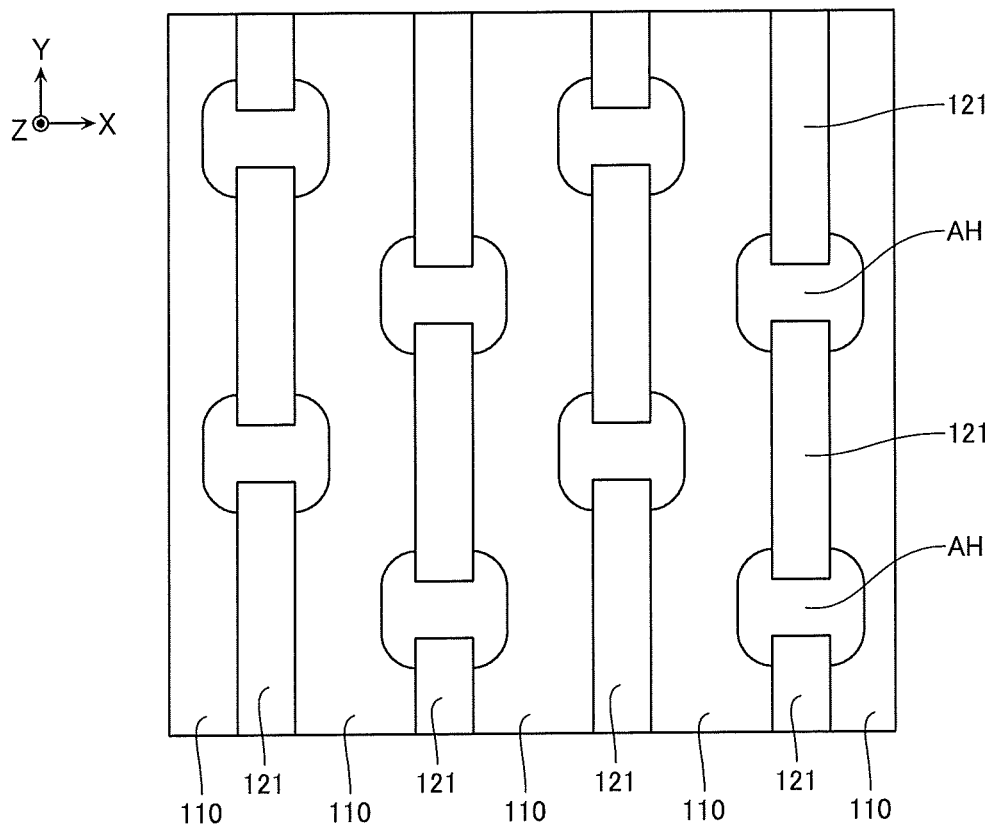
FIG. 20 is a schematic cross-sectional view showing same manufacturing method.
Figure 21:
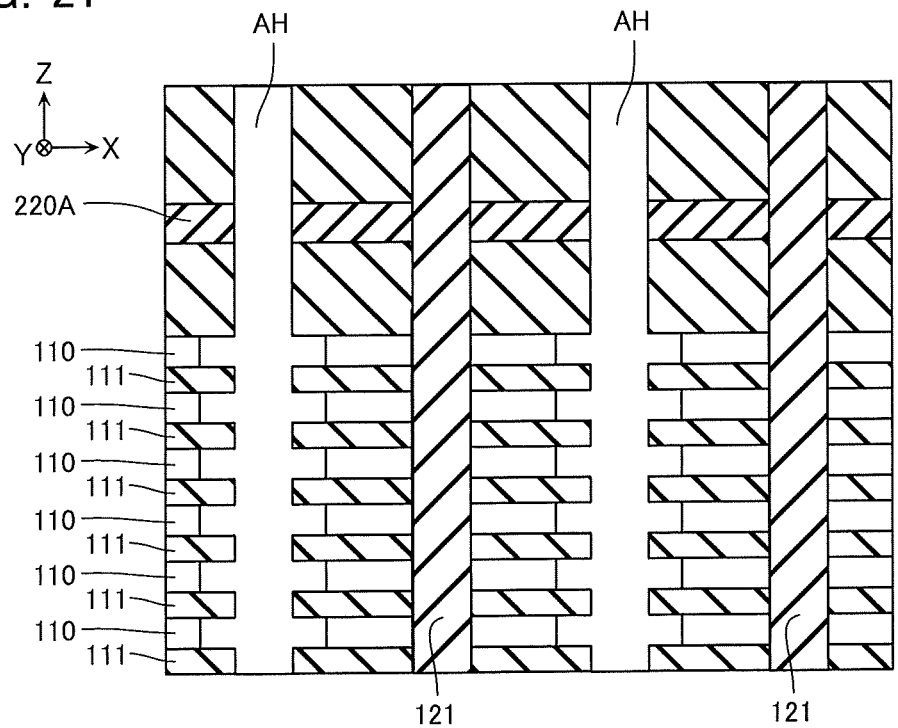
FIG. 21 is a schematic cross-sectional view showing same manufacturing method.

Next, as exemplified in FIGS. 20 and 21, for example, part of the semiconductor portion 110 is selectively removed via the hole AH. This step is performed by a method such as wet etching, for example.

Figure 22:
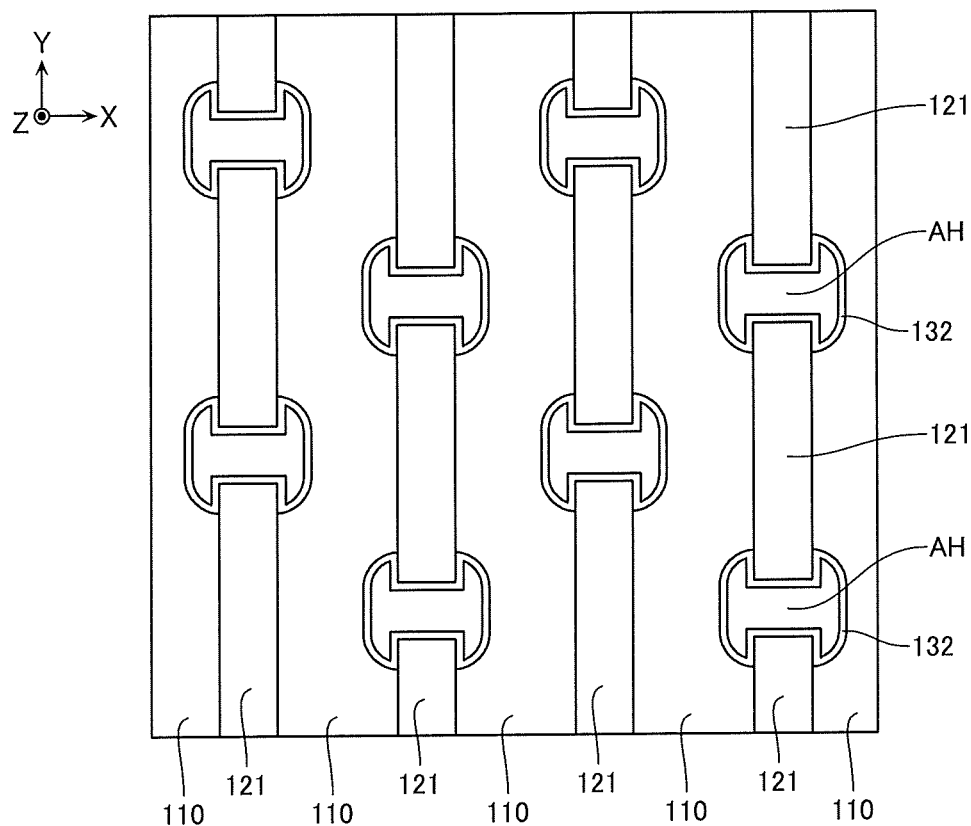
FIG. 22 is a schematic cross-sectional view showing same manufacturing method.
Figure 23:
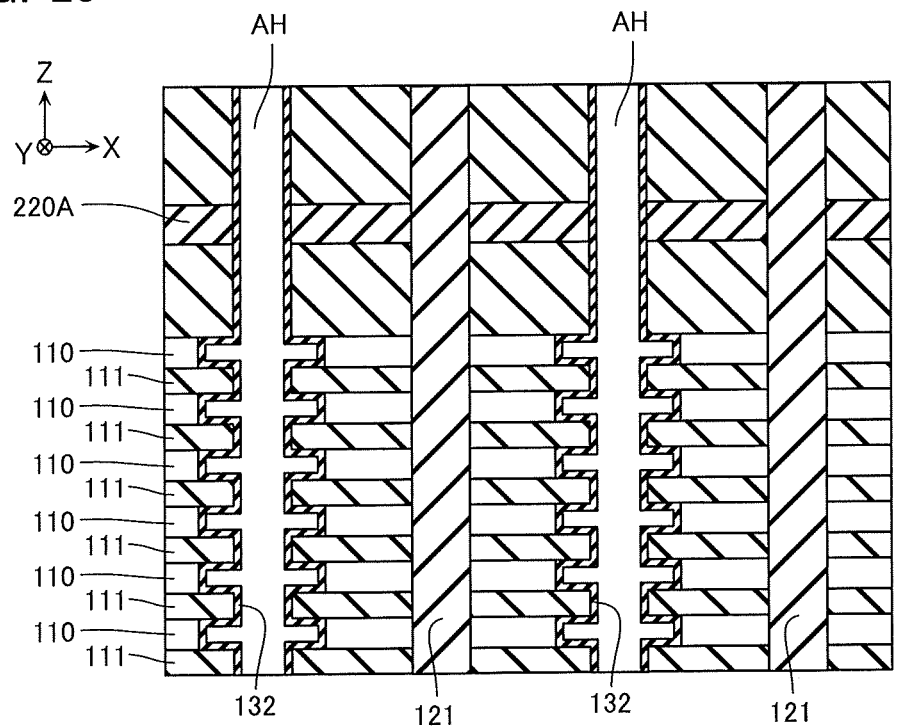
FIG. 23 is a schematic cross-sectional view showing same manufacturing method.

Next, as exemplified in FIGS. 22 and 23, for example, the insulating film 132 is formed on exposed surfaces of the semiconductor portion 110 and the insulating portion 111, via the hole AH. This step is performed by a method such as CVD, for example. The insulating film 132 is formed thinly enough that the hole AH is not completely filled in.

Figure 24:
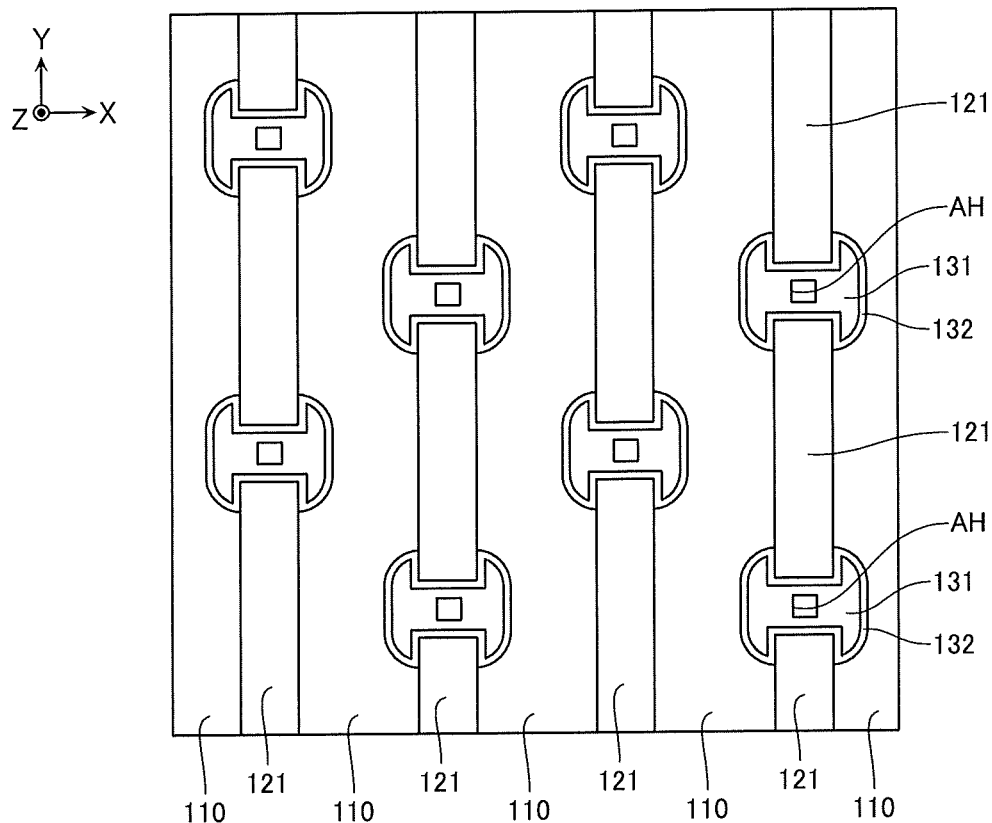
FIG. 24 is a schematic cross-sectional view showing same manufacturing method.
Figure 25:
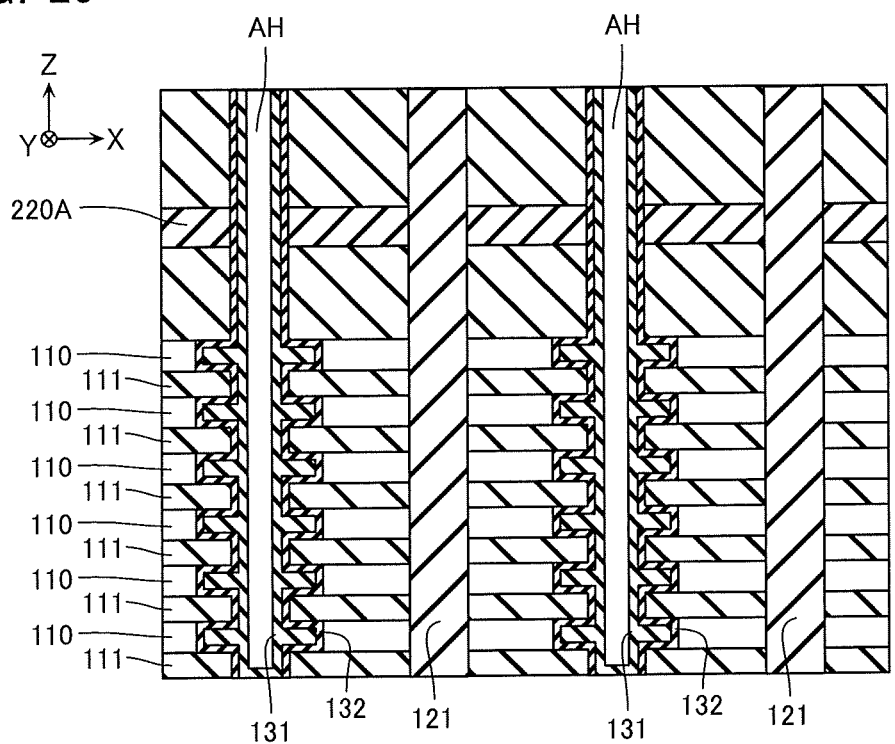
FIG. 25 is a schematic cross-sectional view showing same manufacturing method.

Next, as exemplified in FIGS. 24 and 25, for example, the ferroelectric portion 131 is formed on the insulating film 132, via the hole AH. This step is performed by a method such as CVD, for example. The ferroelectric portion 131 is formed thinly enough that the hole AH is not completely filled in.

Figure 26:
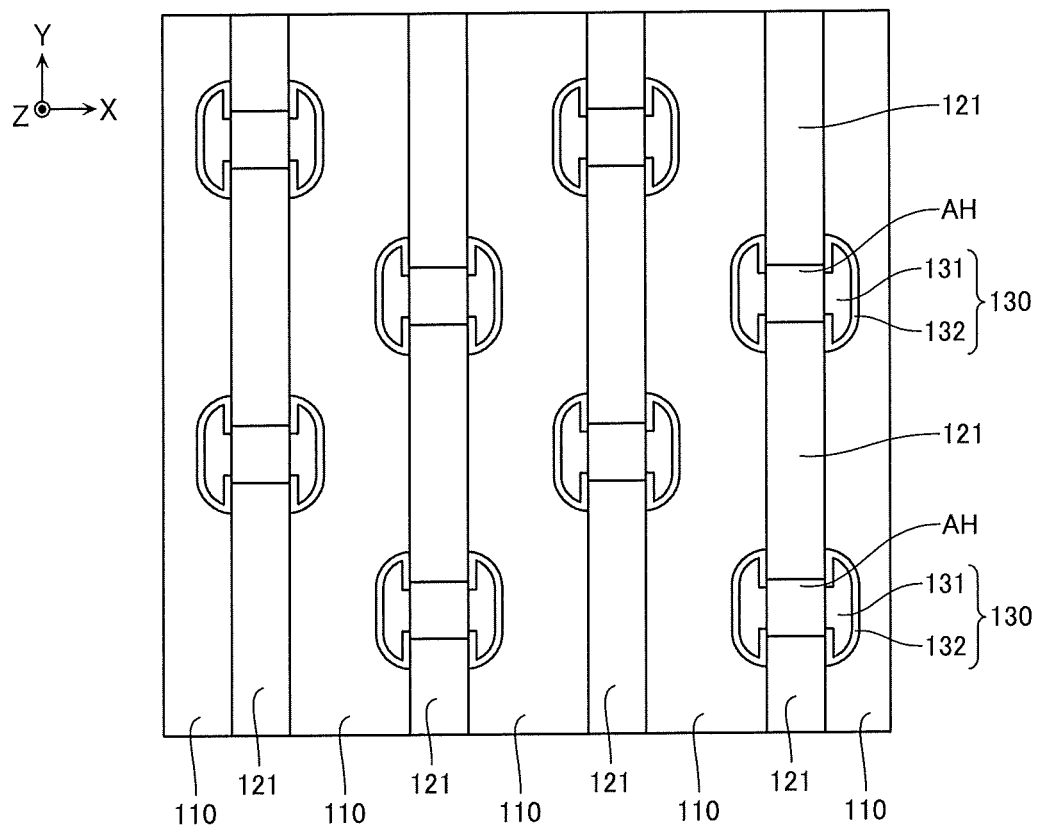
FIG. 26 is a schematic cross-sectional view showing same manufacturing method.
Figure 27:
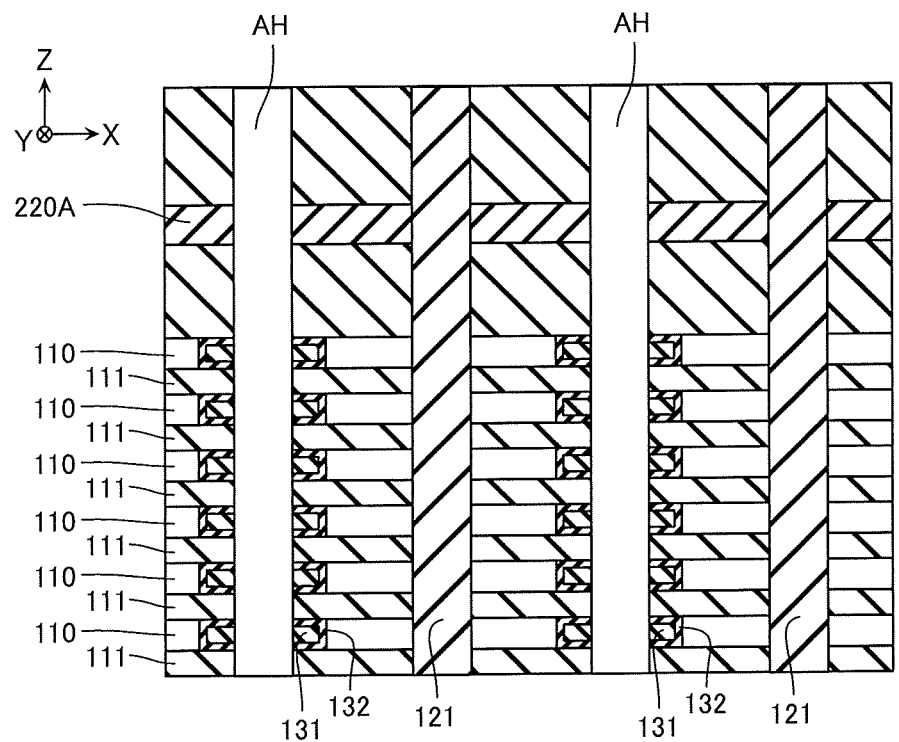
FIG. 27 is a schematic cross-sectional view showing same manufacturing method.

Next, as exemplified in FIGS. 26 and 27, for example, parts of the ferroelectric portion 131 and the insulating film 132 are removed via the hole AH, and the ferroelectric portion 131 and the insulating film 132 are divided in the Z direction. This step is performed by a method such as wet etching, for example.

Figure 28:
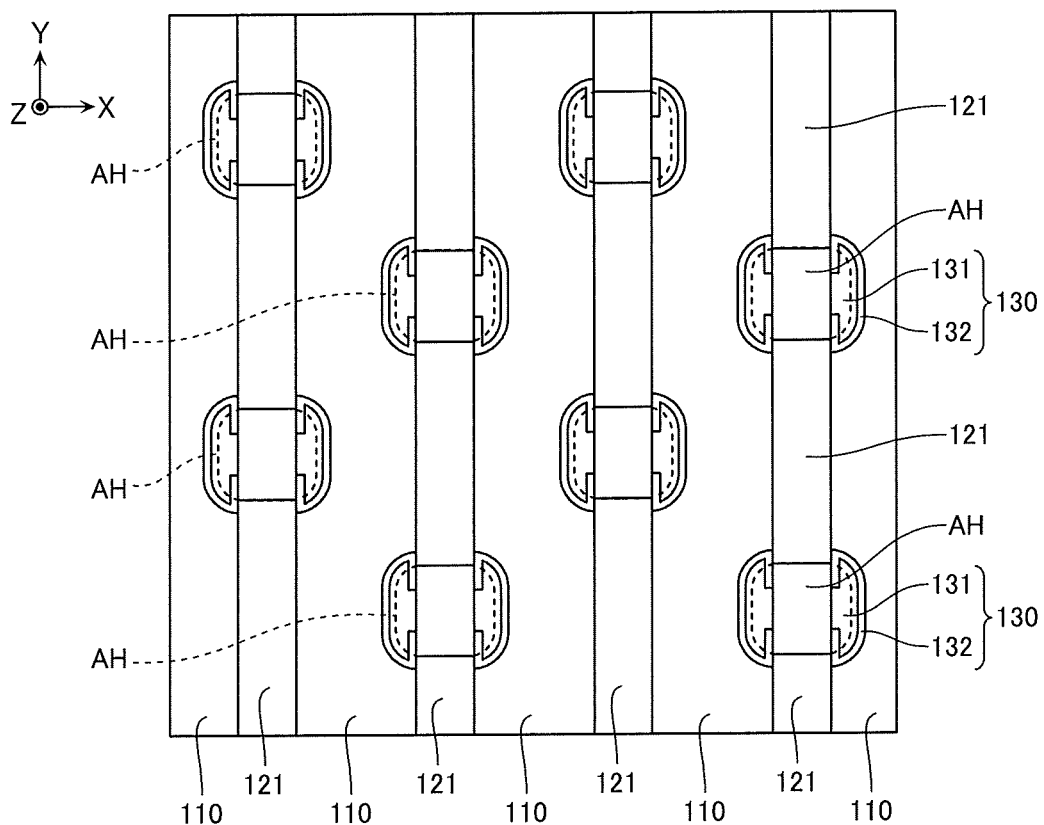
FIG. 28 is a schematic cross-sectional view showing same manufacturing method.
Figure 29:
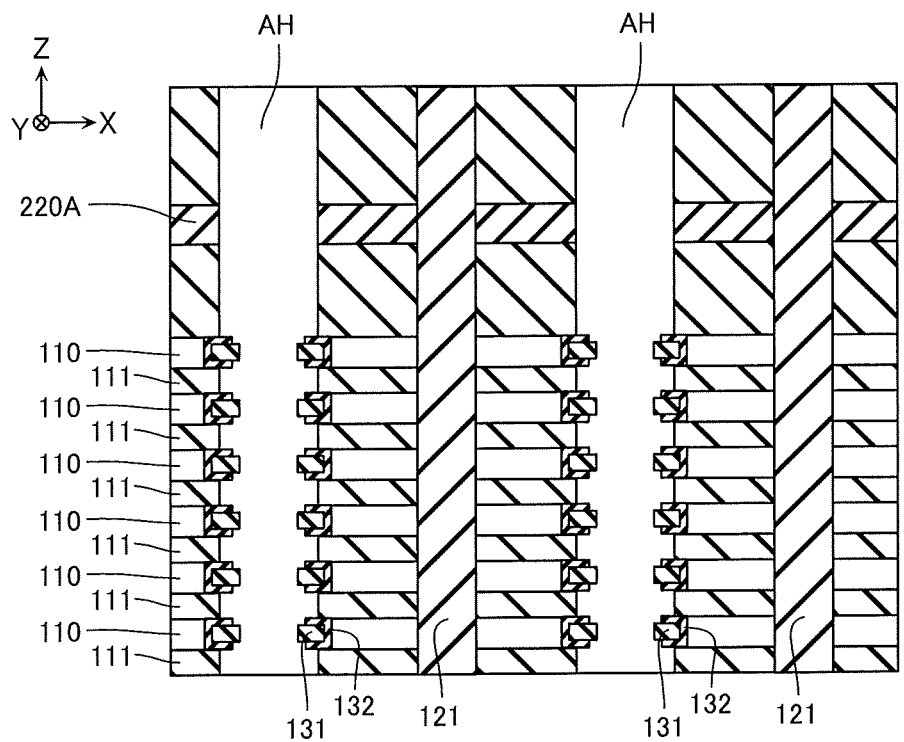
FIG. 29 is a schematic cross-sectional view showing same manufacturing method.

Next, as exemplified in FIGS. 28 and 29, for example, parts of the insulating portions 111 are selectively removed via the hole AH. This step is performed by a method such as wet etching, for example. Note that the portion indicated by the dotted line in FIG. 28 shows schematically an inner peripheral surface of the hole AH appearing in a different cross section to the cross section shown in FIG. 28.

Figure 30:
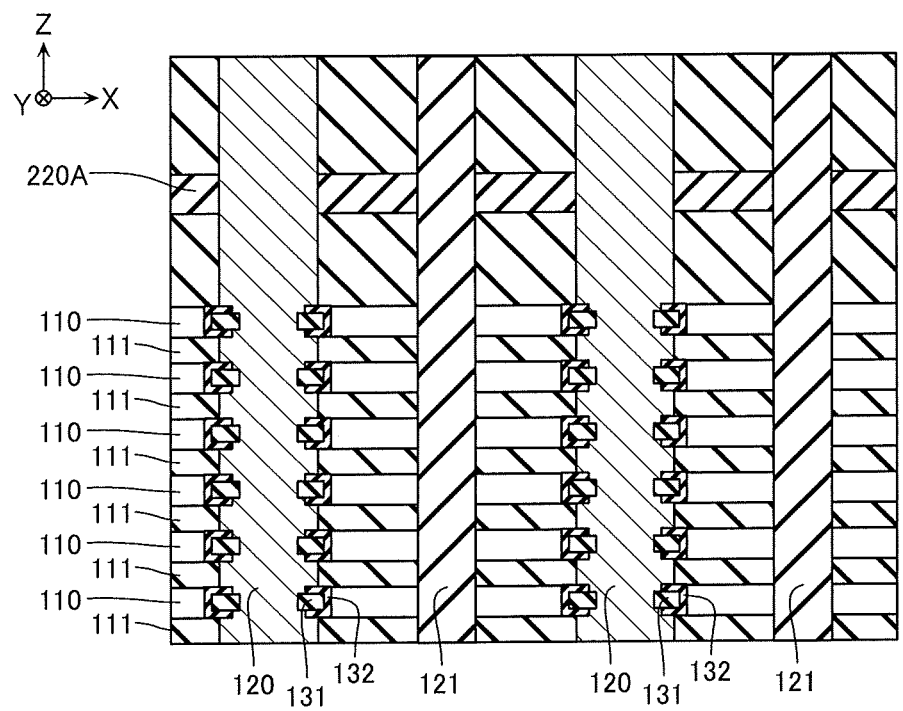
FIG. 30 is a schematic cross-sectional view showing same manufacturing method.

Next, as exemplified in FIG. 30, for example, the conductive portion 120 is formed on an inside of the hole AH. This step is performed by a method such as CVD and wet etching, for example. As a result, a structure of the kind exemplified in FIG. 8 is formed.

Figure 31:
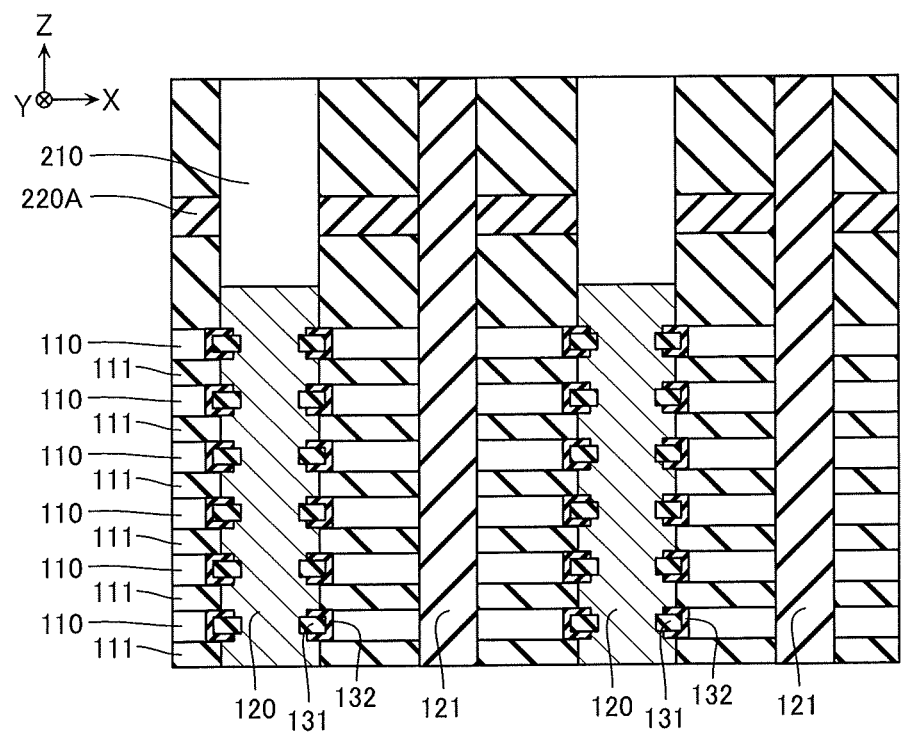
FIG. 31 is a schematic cross-sectional view showing same manufacturing method.

Next, as exemplified in FIG. 31, for example, part of the conductive portion 120 is removed, and the semiconductor portion 210 is formed on the inside of the hole AH. Removal of the conductive portion 120 is performed by a method such as wet etching, for example. Formation of the semiconductor portion 210 is performed by a method such as CVD and etching by RIE, for example.

Figure 32:
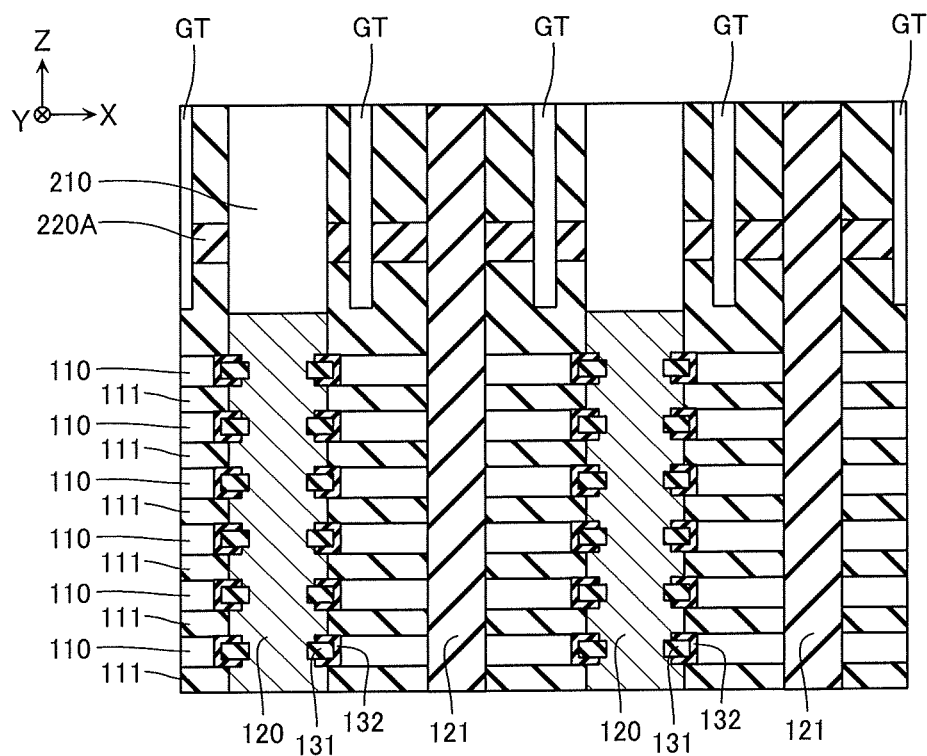
FIG. 32 is a schematic cross-sectional view showing same manufacturing method.

Next, as exemplified in FIG. 32, for example, a trench GT is formed. The trench GT is provided between two insulating portions 121 (memory trenches MT) adjacent in the X direction, and extends in the Z direction and the Y direction. As a result, the sacrifice film 220A is divided in the X direction.

Figure 33:
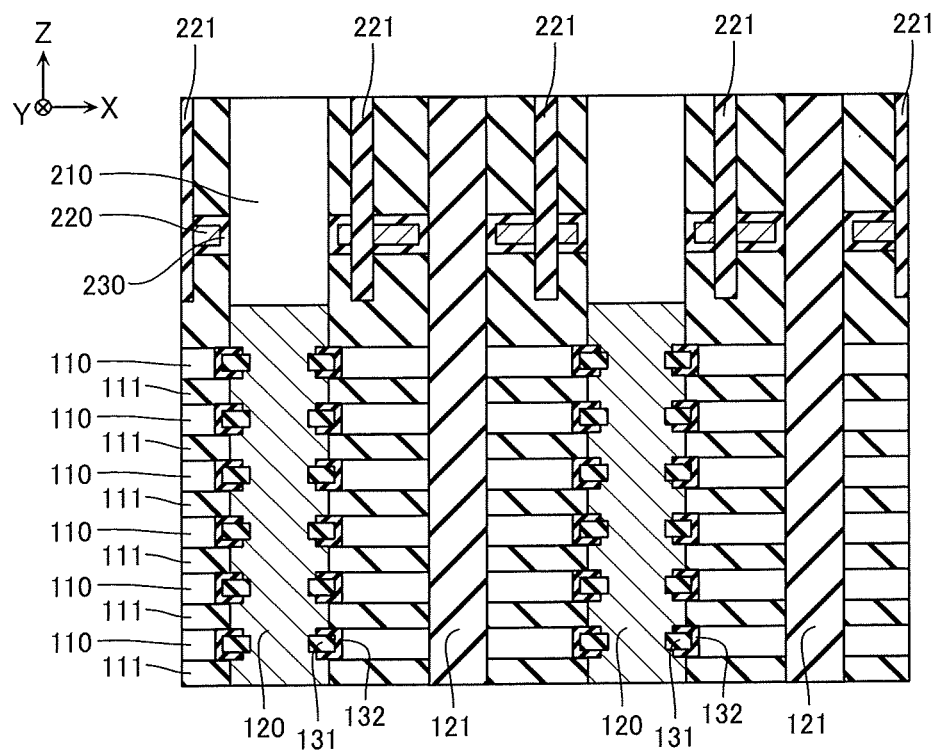
FIG. 33 is a schematic cross-sectional view showing same manufacturing method.

Next, as exemplified in FIG. 33, for example, the sacrifice film 220A is removed via the trench GT, the gate insulating films 230 and the conductive portions 220 are formed, and the insulating portion 221 is formed between the formed conductive portions 220. Removal of the sacrifice film 220A is performed by a method such as wet etching, for example. Formation of the gate insulating film 230 and the conductive portion 220 is performed by a method such as CVD and wet etching, for example. Formation of the insulating portion 221 is performed by a method such as CVD, for example. As a result, a structure of the kind exemplified in FIG. 10 is formed. Note that formation of the gate insulating film 230 may be performed by a method such as oxidation, or may be performed by a method such as CVD immediately before formation of the semiconductor portion 210 in the step exemplified in FIG. 31, for example.

Figure 34:
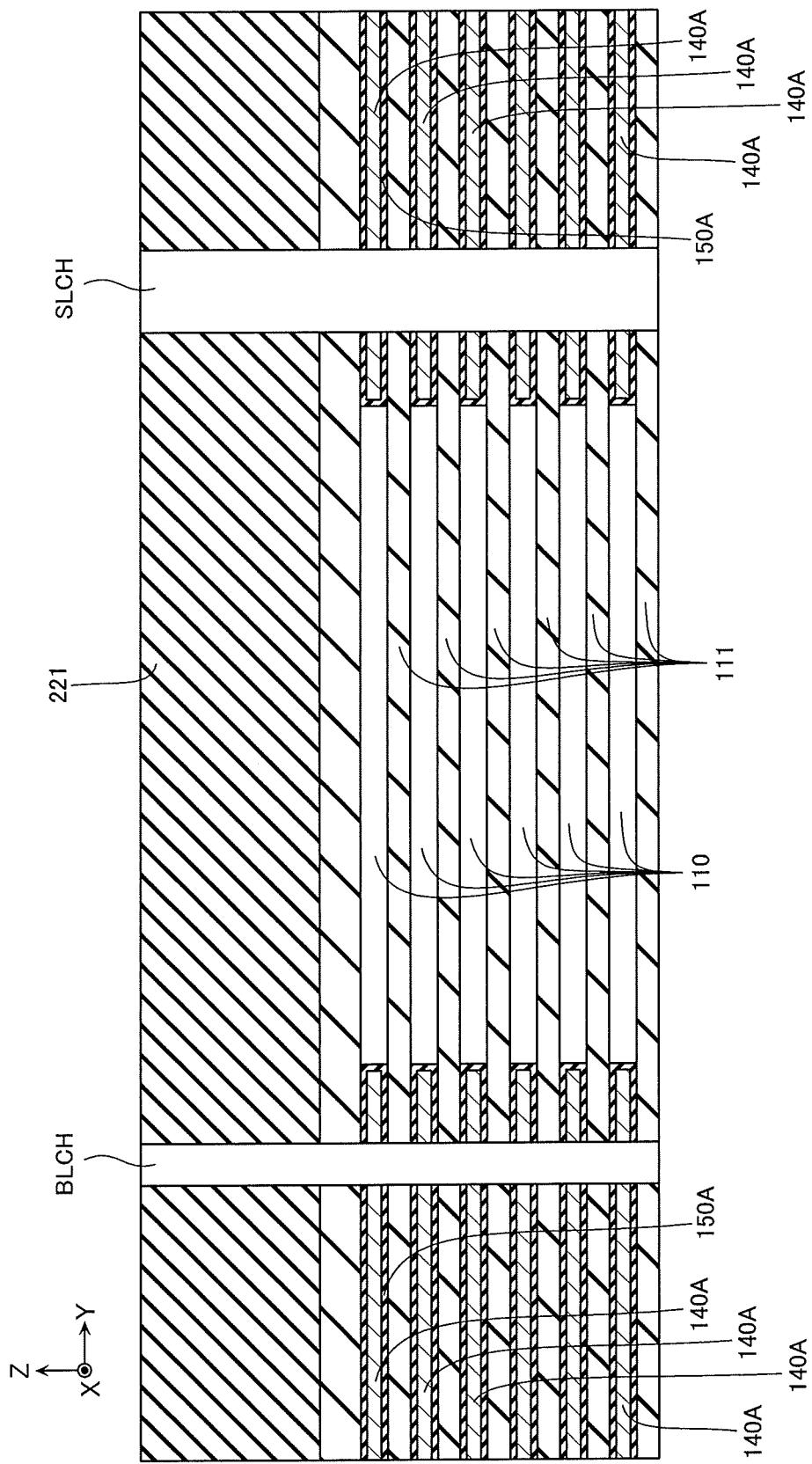
FIG. 34 is a schematic cross-sectional view showing same manufacturing method.

Next, as exemplified in FIG. 34, for example, a bit line contact hole BLCH and a source line contact hole SLCH are formed. The bit line contact hole BLCH and the source line contact hole SLCH each extend in the Z direction, and penetrate a plurality of the conductive portions 140A arranged in the Z direction. This step is performed by a method such as RIE, for example.

Figure 35:
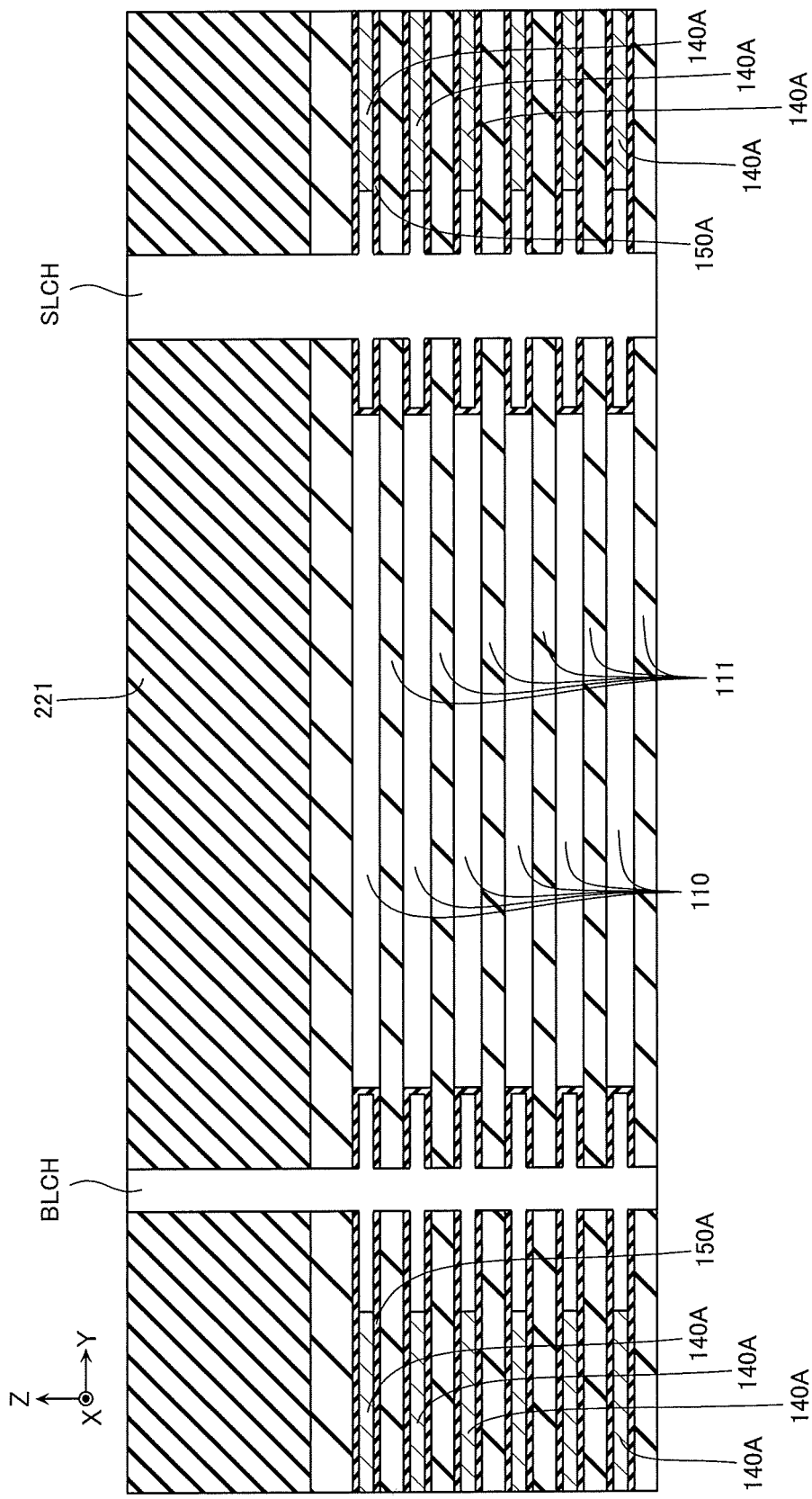
FIG. 35 is a schematic cross-sectional view showing same manufacturing method.
Figure 36:
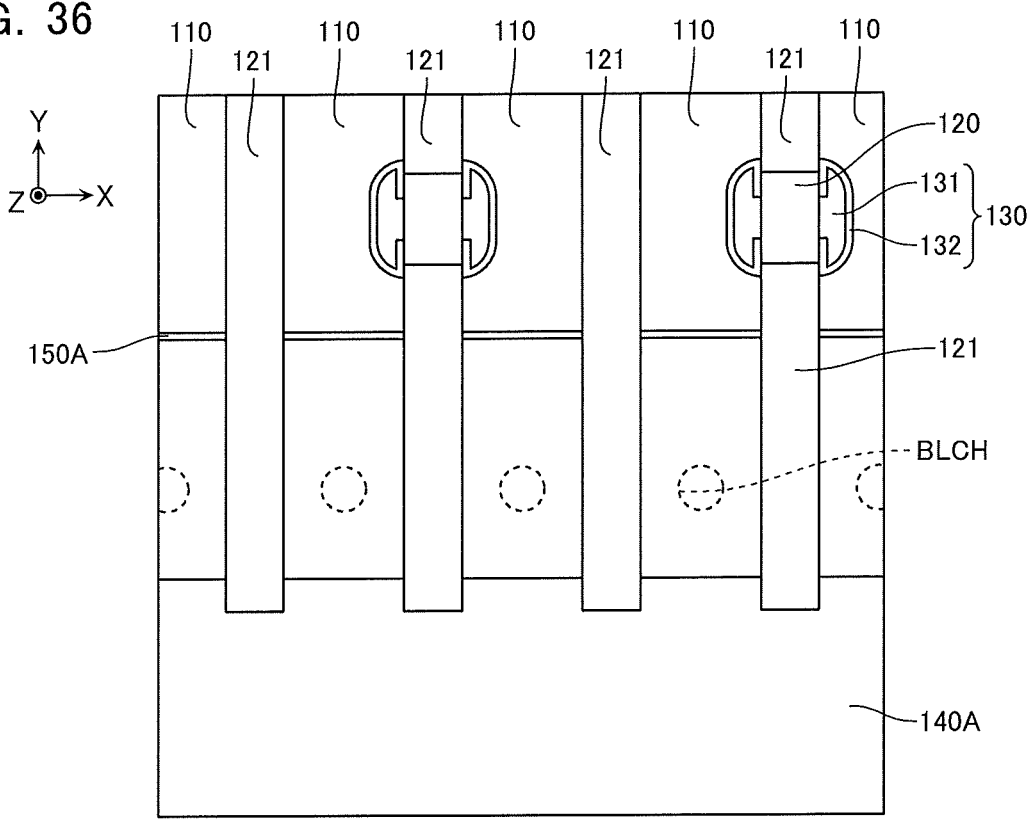
FIG. 36 is a schematic cross-sectional view showing same manufacturing method.

Next, as exemplified in FIGS. 35 and 36, for example, parts of the conductive portions 140A are selectively removed via the bit line contact hole BLCH and the source line contact hole SLCH. This step is performed by a method such as wet etching, for example.

Figure 37:
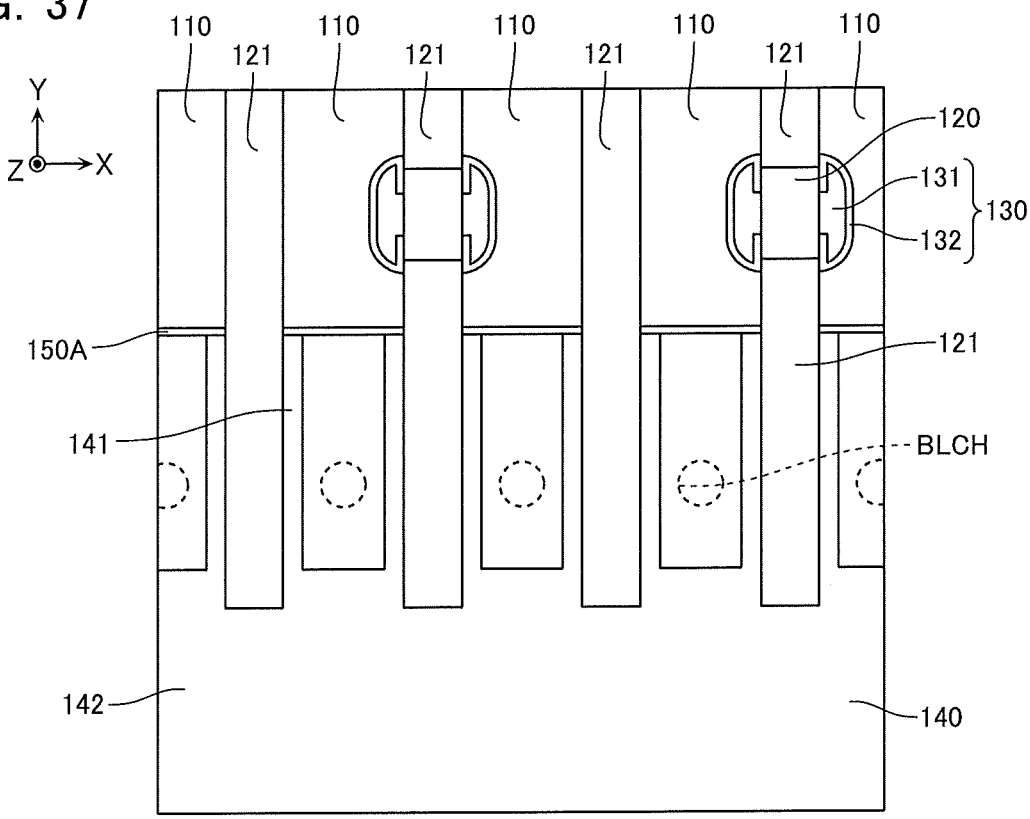
FIG. 37 is a schematic cross-sectional view showing same manufacturing method.

Next, as exemplified in FIG. 37, for example, the likes of a laminated structure of titanium nitride and tungsten is selectively formed on a side surface of the insulating portion 121, via the bit line contact hole BLCH and the source line contact hole SLCH. This step is performed by a method such as CVD, for example.

Figure 38:
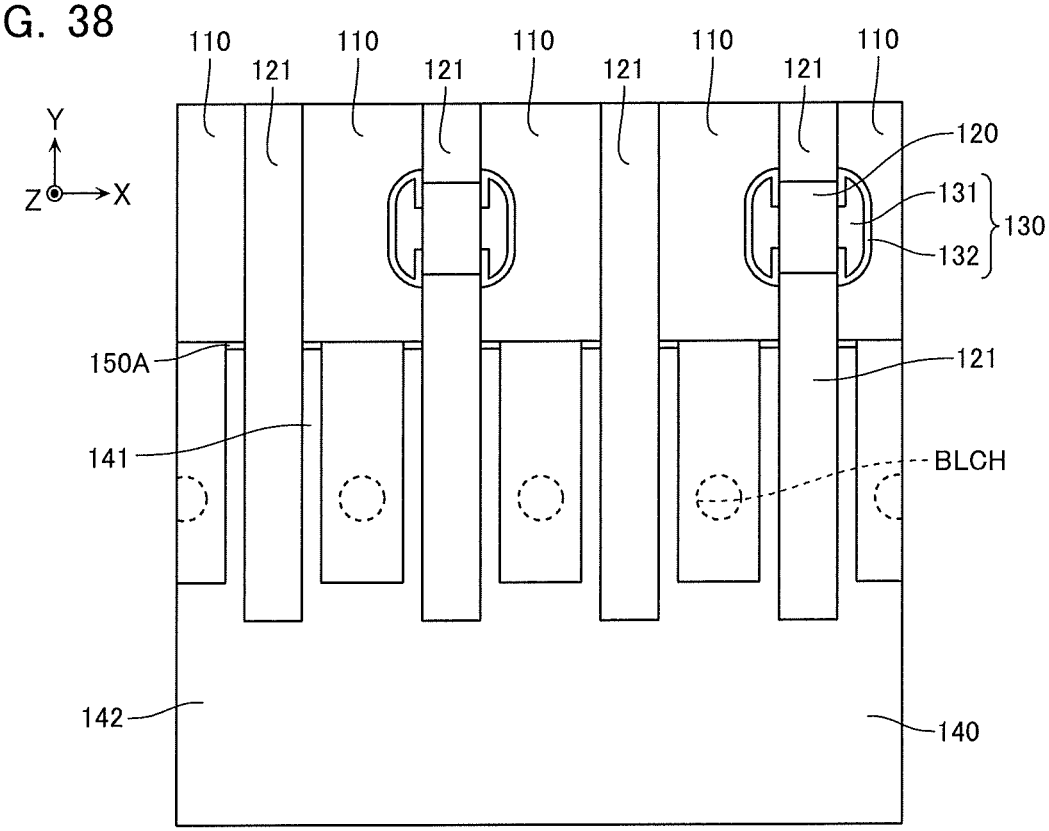
FIG. 38 is a schematic cross-sectional view showing same manufacturing method.

Next, as exemplified in FIG. 38, for example, parts of the insulating portion 150A are selectively removed via the bit line contact hole BLCH and the source line contact hole SLCH. This step is performed by a method such as wet etching, for example.

Figure 39:
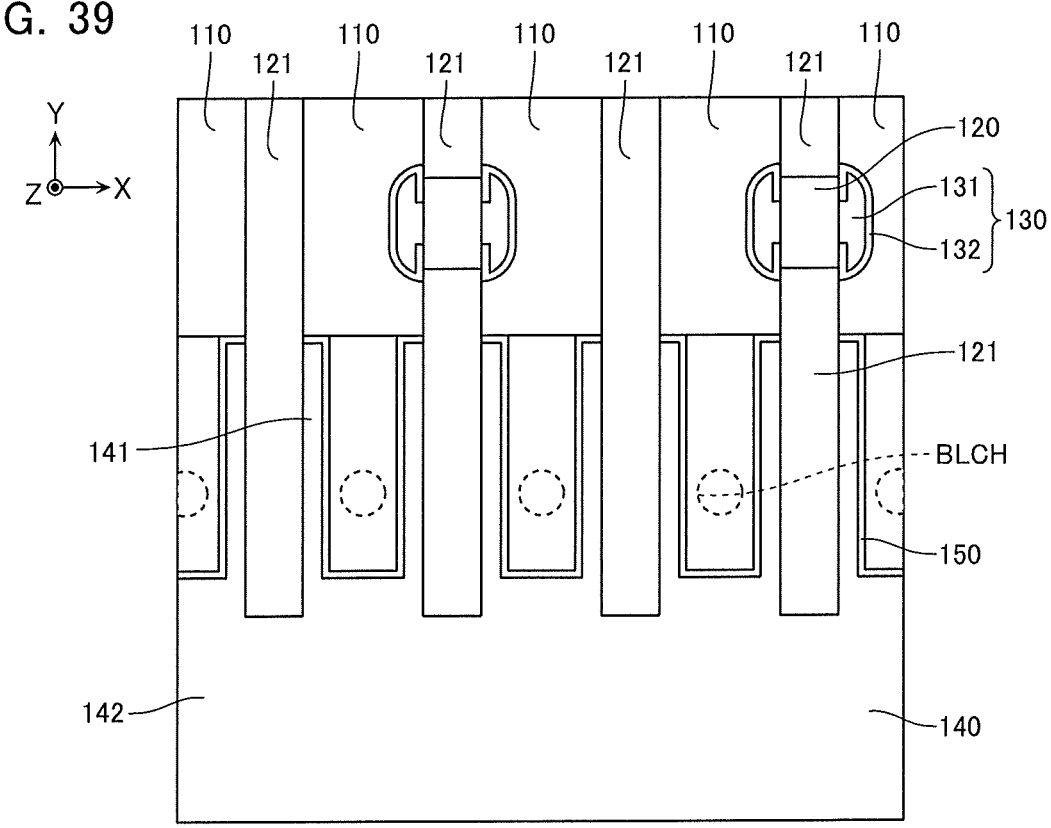
FIG. 39 is a schematic cross-sectional view showing same manufacturing method.

Next, as exemplified in FIG. 39, for example, the gate insulating film 150 is formed on side surfaces in the X direction and the Y direction of the conductive portion 140, via the bit line contact hole BLCH and the source line contact hole SLCH. This step is performed by selective oxidation or selective deposition, for example.

Then, an end section in the Y direction of the semiconductor portion 110 is formed by a method such as CVD via the bit line contact hole BLCH and the source line contact hole SLCH, for example. As a result, a structure of the kind exemplified in FIG. 9 is formed. Then, configurations of the conductive portion 310, the conductive portion 320, the conductive portion 330, the conductive portion 410, the conductive portion 420, and so on, described with reference to FIG. 6, and so on, are formed, whereby the structure described with reference to FIGS. 3-10 is formed.

Advantages

Figure 40:
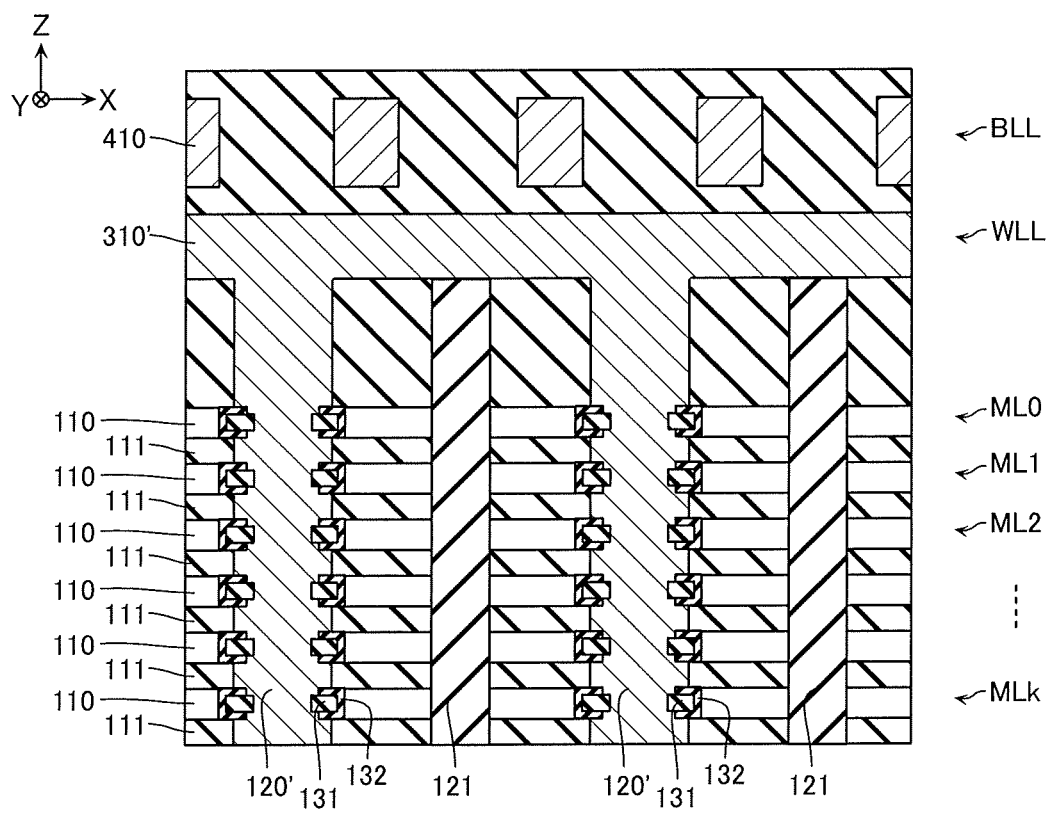
FIG. 40 is a schematic XZ cross-sectional view showing a semiconductor memory device according to a comparative example.

FIG. 40 is a schematic XZ cross-sectional view showing a configuration example of a semiconductor memory device according to a comparative example. The semiconductor memory device according to the comparative example is basically configured similarly to the semiconductor memory device according to the first embodiment. However, the semiconductor memory device according to the comparative example does not have the transistor layer TL, and, in the semiconductor memory device according to the comparative example, conductive portions 120' that function as the local word lines LWLay, LWLby are directly connected to a conductive portion 310' that functions as the global word lines GWLay, GWLby.

The semiconductor memory device according to the comparative example includes the ferroelectric portion 131, similarly to in the first embodiment. The semiconductor memory device including the ferroelectric portion 131 is expected to operate with lower electric power consumption, compared to a semiconductor memory device utilizing a charge accumulating film of the likes of silicon nitride, for example.

In the write operation of such a semiconductor memory device, it is conceivable that, for example, a write voltage having a positive polarity is supplied to the conductive portion 120', and a ground voltage or a voltage having a negative polarity is supplied to the semiconductor portion 110. As a result, dielectric polarization occurs, and a positive charge is induced in a surface on a semiconductor portion 110 side of the ferroelectric portion 131. Consequently, a negative charge is induced in a surface on a ferroelectric portion 131 side of the semiconductor portion 110. Hence, the threshold voltage of the memory cell MC will attain a negative magnitude, and the memory cell MC will be in an ON state even in a state where the conductive portion 120' is not applied with a voltage.

Moreover, in the erase operation of such a semiconductor memory device, it is conceivable that, for example, a ground voltage or a voltage having a negative polarity is supplied to the conductive portion 120', and an erase voltage having a positive polarity is supplied to the semiconductor portion 110. As a result, dielectric polarization occurs, and a negative charge is induced in the surface on the semiconductor portion 110 side of the ferroelectric portion 131. Consequently, a positive charge is induced in the surface on the ferroelectric portion 131 side of the semiconductor portion 110. Hence, the threshold voltage of the memory cell MC will attain a positive magnitude, and the memory cell MC will be in an OFF state in a state where the conductive portion 120' is not applied with a voltage.

Now, in the case where, for example, the write operation is performed on the ferroelectric portion 131, sometimes, electrons in the semiconductor portion 110 tunnel into the ferroelectric portion 131 via the insulating film 132, and are accumulated in the ferroelectric portion 131. When electrons are accumulated in the ferroelectric portion 131, it has sometimes ended up becoming impossible for a negative charge to be suitably induced in the surface on the ferroelectric portion 131 side of the semiconductor portion 110 due to repulsion from these electrons, and it has sometimes ended up becoming impossible for the write operation to be suitably executed. Moreover, it has sometimes ended up becoming impossible for the erase operation to be suitably executed due to a similar phenomenon.

Now, a pulse width of a voltage pulse (a time that a voltage is supplied) required for generating dielectric polarization in the ferroelectric portion 131, and a pulse width of a voltage pulse required for accumulating a charge in the ferroelectric portion 131, differ greatly. For example, under certain conditions, dielectric polarization in the ferroelectric portion 131 occurs by supplying the ferroelectric portion 131 with a voltage pulse having a pulse width of about several nano seconds. On the other hand, accumulation of a charge, and so on, to the ferroelectric portion 131 does not occur unless a voltage pulse having a pulse width of about several micro seconds is supplied to the ferroelectric portion 131. Hence, in order to provide a semiconductor memory device that operates suitably, it is conceivable to make the pulse width of the voltage pulse supplied to the conductive portion 120' sufficiently small.

However, in the semiconductor memory device according to the comparative example, since all of the local word lines LWLay, LWLby are directly connected to the global word lines GWLay, GWLby, then sometimes, wiring capacities of the local word lines LWLay, LWLby and the global word lines GWLay, GWLby are relatively large. Hence, sometimes, the pulse width of the pulse voltage supplied to the conductive portion 120' cannot be made sufficiently small.

Accordingly, in the semiconductor memory device according to the first embodiment, the word line select transistors STWay, STWby are provided between the local word lines LWLay, LWLby and the global word lines GWLay, GWLby. By selectively making the local word lines LWLay, LWLby corresponding to a certain bit line BLx, of the plurality of bit lines BL0-BL1 electrically continuous with the global word lines GWLay, GWLby, such a configuration makes it possible to greatly reduce the wiring capacity of the local word lines LWLay, LWLby, and thereby control these voltages at high speed. This makes it possible for the pulse width of the voltage pulse supplied to the conductive portion 120 to be made sufficiently small, and thereby makes it possible to provide a semiconductor memory device that suppresses accumulation of a charge, and so on, to the ferroelectric portion 131, and operates suitably. Note that, it is conceivable to adjust a pulse width of a voltage pulse supplied with the conductive portion 120 in the write operation and the erase operation to a value smaller than one micro second.

Note that in order to reduce to a minimum the wiring capacity of the local word lines LWLay, LWLby, it is conceivable that in the write operation, for example, one word line select line SGWax of the plurality of word line select lines SGWa1-SGWa1 is selectively set to "H" state. However, in the case where, for example, several thousands of the word line select lines are provided (in the case where "l" is several thousand), it is conceivable that even if about several tens of those word line select lines are set to "H" state, the wiring capacity of the local word lines LWLay, LW1by can be sufficiently reduced. Moreover, depending on the likes of detailed configuration or operating conditions, it is conceivable that speeding up of operation can be achieved by simultaneously setting a plurality of the word line select lines to "H" state.

Moreover, such a method may be applied not only to the write operation, but also to the erase operation. In this case, a direction of an electric field supplied to the ferroelectric portion 131 will be a reverse direction to in the write operation. Similar advantages to in the write operation are expected in such a method too.

Second Embodiment

Figure 41:
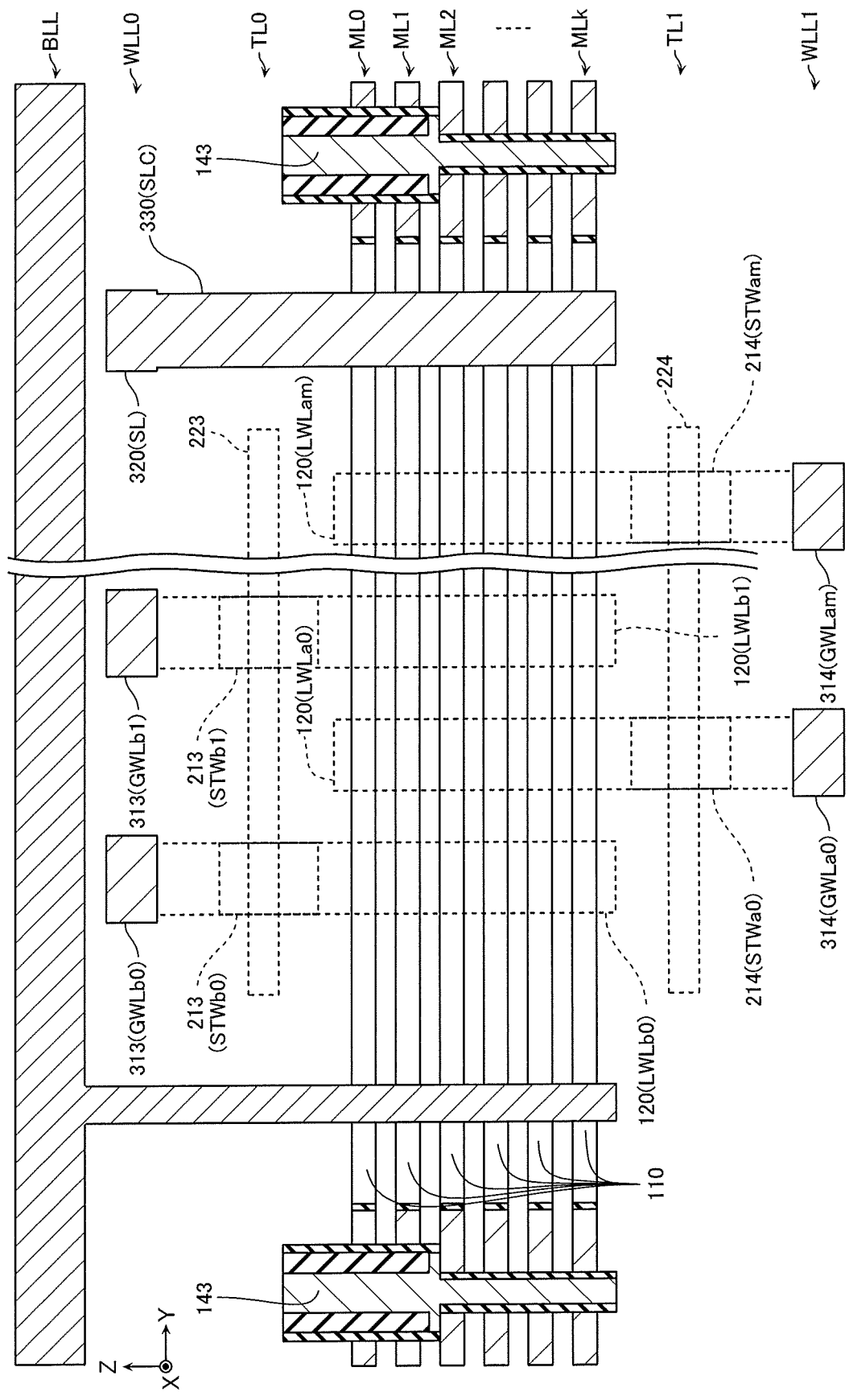
FIG. 41 is a schematic YZ cross-sectional view showing a configuration example of a semiconductor memory device according to a second embodiment.
Figure 42:
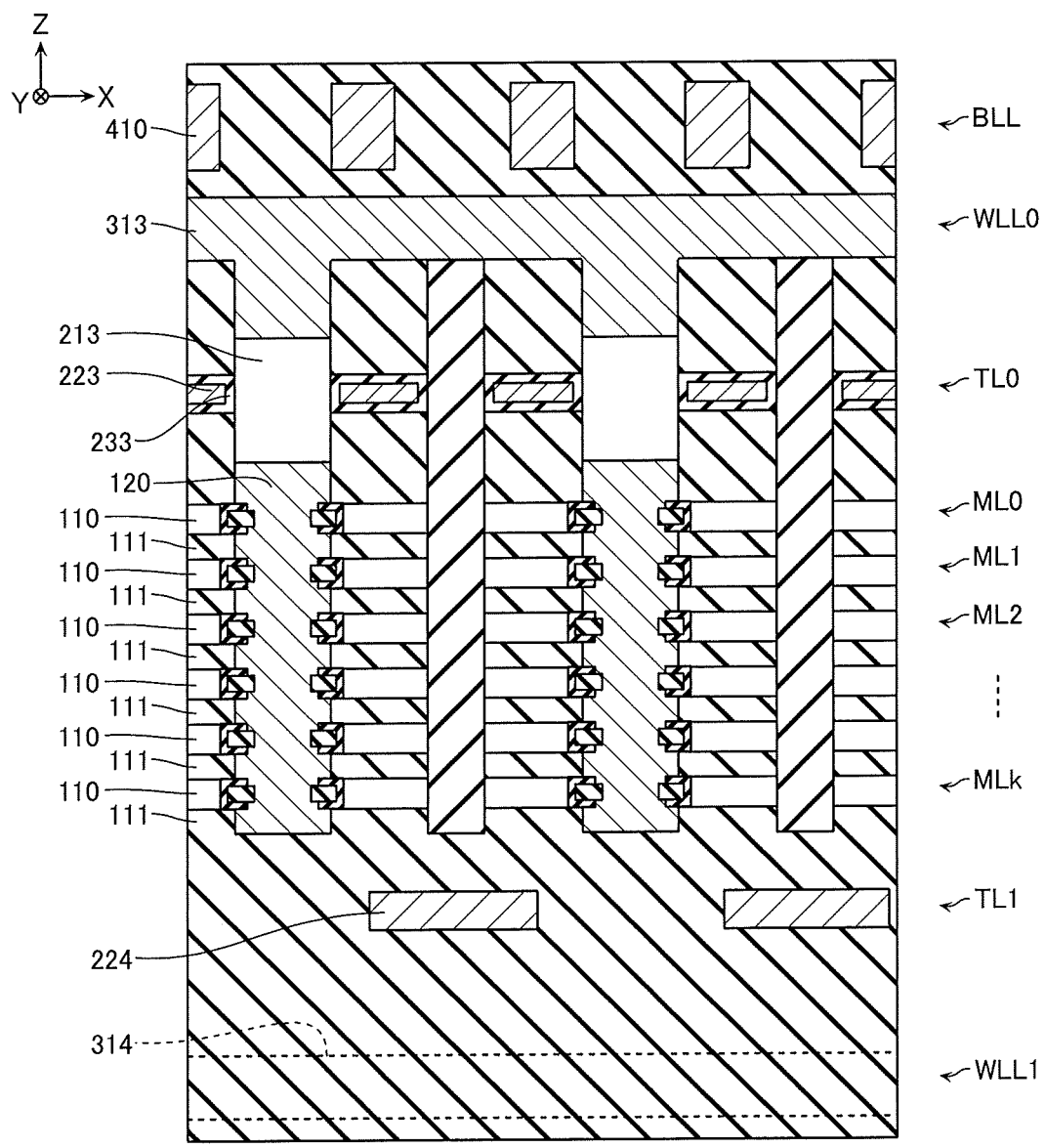
FIG. 42 is a schematic XZ cross-sectional view showing same configuration example.
Figure 43:
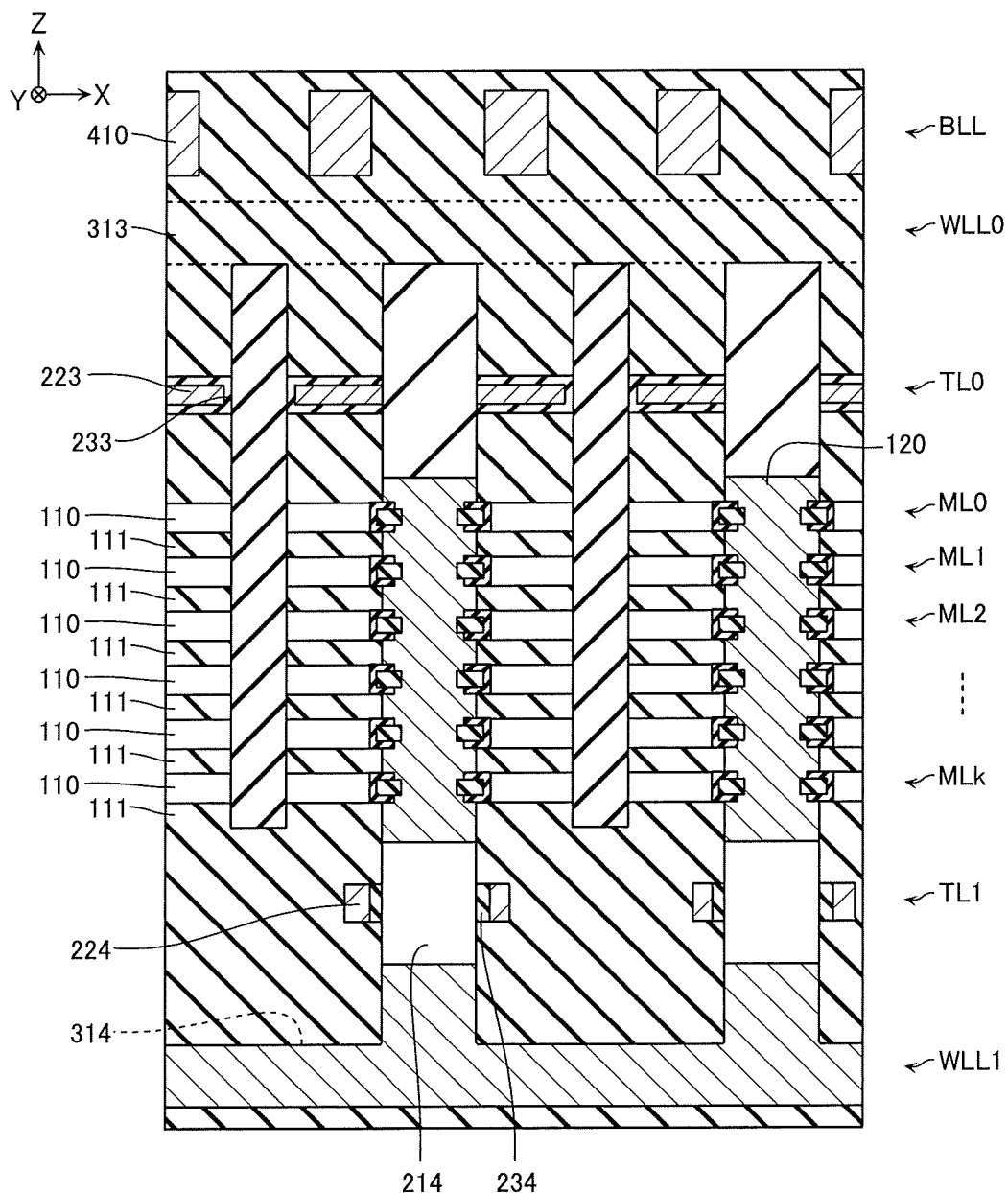
FIG. 43 is a schematic XZ cross-sectional view showing same configuration example.

FIG. 41 is a schematic YZ cross-sectional view showing a configuration example of a semiconductor memory device according to a second embodiment. FIGS. 42 and 43 are schematic XZ cross-sectional views for describing same configuration example.

As shown in FIG. 41, the semiconductor memory device according to the second embodiment includes: the plurality of memory layers ML0-MLk arranged in the Z direction; a transistor layer TL0 provided above the memory layers ML0-MLk; a word line layer WLL0 provided above the transistor layer TL0; and the bit line layer BLL provided above the word line layer WLL0. In addition, the semiconductor memory device according to the present embodiment includes: a transistor layer TL1 provided below the memory layers ML0-MLk; and a word line layer WLL1 provided below the transistor layer TL1.

The memory layers ML0-MLk and the bit line layer BLL are configured similarly to the memory layers ML0-MLk and the bit line layer BLL according to the first embodiment.

Now, as described with reference to FIG. 6, and so on, the transistor layer TL according to the first embodiment includes both a configuration corresponding to the word line select transistors STWa0-STWam and a configuration corresponding to the word line select transistors STWb0-STWbm. On the other hand, as shown in FIG. 41, the transistor layer TL0 according to the present embodiment includes a configuration corresponding to the word line select transistors STWb0-STWbm, and the transistor layer TL1 according to the present embodiment includes a configuration corresponding to the word line select transistors STWa0-STWam.

That is, as shown in FIGS. 41 and 42, for example, the transistor layer TL0 includes: a plurality of semiconductor portions 213 that are arranged in the X direction and the Y direction; a plurality of conductive portions 223 that are arranged in the X direction, extend in the Y direction, and face outer peripheral surfaces of the plurality of semiconductor portions 213; and a gate insulating film 233 of the likes of silicon oxide, provided between the semiconductor portion 213 and the conductive portion 223.

The semiconductor portion 213 includes the likes of polycrystalline silicon, for example. The outer peripheral surface of the semiconductor portion 213 faces the conductive portion 223, and functions as the channel region of the word line select transistor STWbx. A lower end of the semiconductor portion 213 is connected to the conductive portion 120.

The conductive portion 223 includes the likes of a laminated structure of titanium nitride and tungsten, for example. The conductive portion 223 extends in the Y direction, and functions as the word line select line SGWbx. In addition, the conductive portion 223 faces the outer peripheral surfaces of a plurality of the semiconductor portions 213 arranged in the Y direction, and functions as the gate electrodes of the word line select transistors STWb0-STWbm.

Moreover, as shown in FIGS. 41 and 43, for example, the transistor layer TL1 includes: a plurality of semiconductor portions 214 that are arranged in the X direction and the Y direction; a plurality of conductive portions 224 that are arranged in the X direction, extend in the Y direction, and face outer peripheral surfaces of the plurality of semiconductor portions 214; and a gate insulating film 234 of the likes of silicon oxide, provided between the semiconductor portion 214 and the conductive portion 224.

The semiconductor portion 214 includes the likes of polycrystalline silicon, for example. The outer peripheral surface of the semiconductor portion 214 faces the conductive portion 224, and functions as the channel region of the word line select transistor STWax. An upper end of the semiconductor portion 214 is connected to the conductive portion 120.

The conductive portion 224 includes the likes of a laminated structure of titanium nitride and tungsten, for example. The conductive portion 224 extends in the Y direction, and functions as the word line select line SGWax. In addition, the conductive portion 224 faces the outer peripheral surfaces of a plurality of the semiconductor portions 214 arranged in the Y direction, and functions as the gate electrodes of the word line select transistors STWa0-STWam.

Moreover, as described with reference to FIG. 6, and so on, the word line layer WLL according to the first embodiment includes both a configuration corresponding to the global word lines GWLa0-GWLam and a configuration corresponding to the global word lines GWLb0-GWLbm. On the other hand, as shown in FIG. 41, the word line layer WWL0 according to the present embodiment includes a configuration corresponding to the global word lines GWLb0-GWLbm, and the word line layer WWL1 according to the present embodiment includes a configuration corresponding to the global word lines GWLa0-GWLam.

That is, as shown in FIG. 41, for example, the word line layer WLL0 includes a plurality of conductive portions 313 and a conductive portion 320 that are aligned in the Y direction.

The conductive portion 313 includes the likes of a laminated structure of titanium nitride (TiN) and tungsten (W), for example. The conductive portion 313 extends in the X direction, and is commonly connected to upper ends of a plurality of the semiconductor portions 213 aligned in the X direction. The conductive portions 313 respectively function as the global word lines GWLby.

The word line layer WLL1 includes a plurality of conductive portions 314 that are aligned in the Y direction.

The conductive portion 314 includes the likes of a laminated structure of titanium nitride (TiN) and tungsten (W), for example. The conductive portion 314 extends in the X direction, and is commonly connected to lower ends of a plurality of the semiconductor portions 214 aligned in the X direction. The conductive portions 314 respectively function as the global word lines GWLay.

Such a configuration also makes it possible to manufacture a semiconductor memory device displaying similar advantages to in the first embodiment. Moreover, by providing the word line select lines SGWb0-SGWb1 in the transistor layer TL0 and providing the word line select lines SGWa0-SGWa1 in the transistor layer TL1, such a configuration makes it possible to increase a distance between word line select lines adjacent in the X direction, and thereby makes it possible to manufacture a semiconductor memory device that reduces electrostatic capacitance between these wirings, and operates even more suitably.

Other Embodiments

That concludes description of the semiconductor memory devices according to the first embodiment and the second embodiment. However, the above-described configurations are merely exemplifications, and it is possible for specific configurations to be appropriately changed as follows, for example.

[Transistor Layer]

For example, in the first embodiment and the second embodiment, the word line select transistor is connected to only one of the upper end and the lower end of the conductive portion 120. However, as exemplified in FIG. 44, for example, the word line select transistor may be connected to both of the upper end and the lower end of the conductive portion 120.

Figure 44:
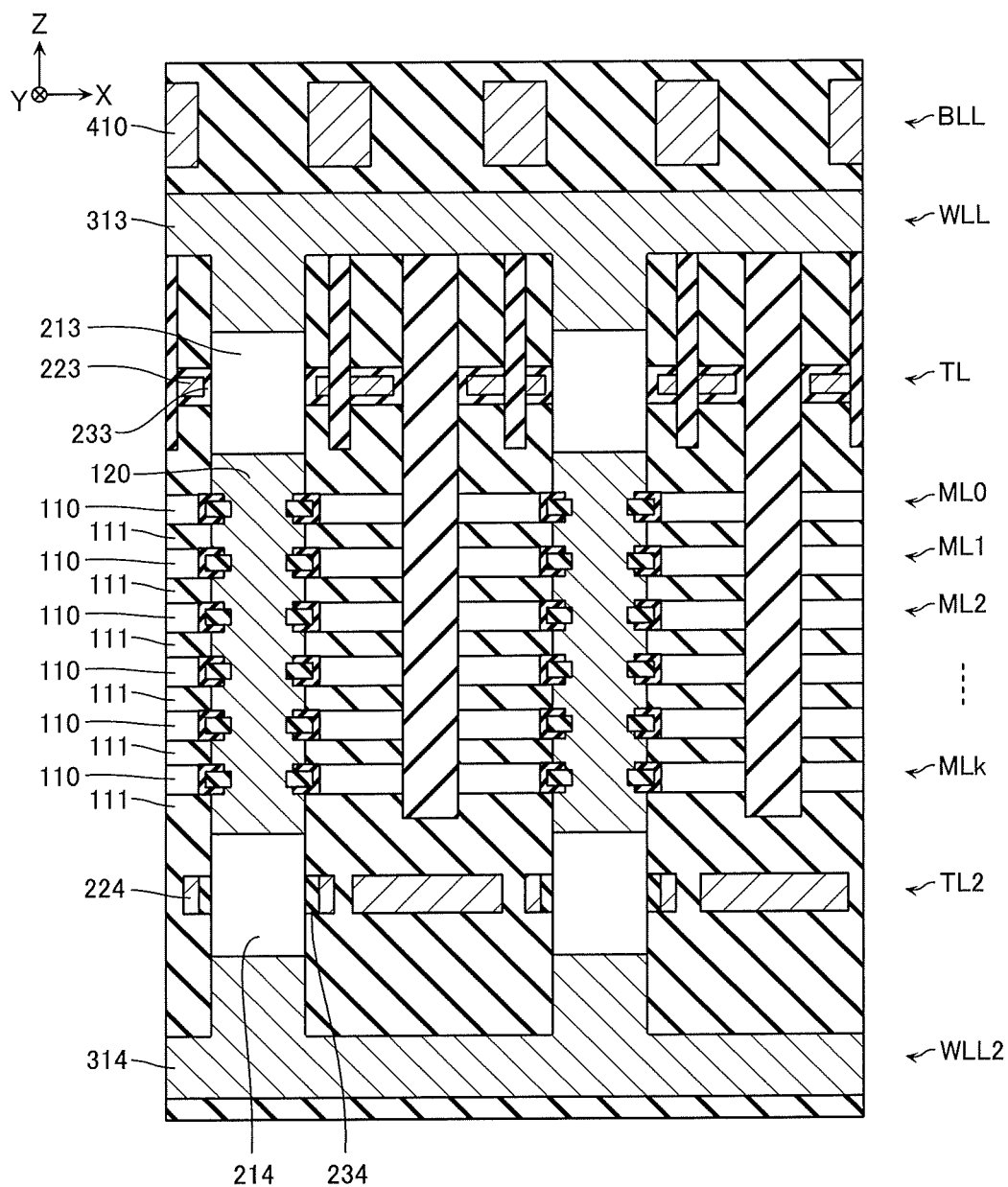
FIG. 44 is a schematic XZ cross-sectional view showing a configuration example of a semiconductor memory device according to another example.

The configuration exemplified in FIG. 44 includes the transistor layer TL and word line layer WLL according to the first embodiment, and a transistor layer TL2 and word line layer WLL2. The transistor layer TL2 and word line layer WLL2 are basically configured similarly to the transistor layer TL1 and word line layer WLL1 according to the second embodiment. However, the transistor layer TL2, similarly to the transistor layer TL according to the first embodiment, includes both a configuration corresponding to the word line select transistors STWa0-STWam and a configuration corresponding to the word line select transistors STWb0-STWbm. Moreover, the word line layer WLL2, similarly to the word line layer WLL according to the first embodiment, includes both a configuration corresponding to the global word lines GWLa0-GWLam and a configuration corresponding to the global word lines GWLb0-GWLbm.

Such a configuration makes it possible that, for example, by supplying in advance different voltages to the conductive portion 313 and the conductive portion 314 and switching voltages of the gate electrodes (conductive portions 223, 224) of the word line select transistors, a voltage of the conductive portion 120 is controlled at even higher speed. Moreover, such a configuration also makes it possible to supply a voltage to a non-selected conductive portion 120.

Figure 45:
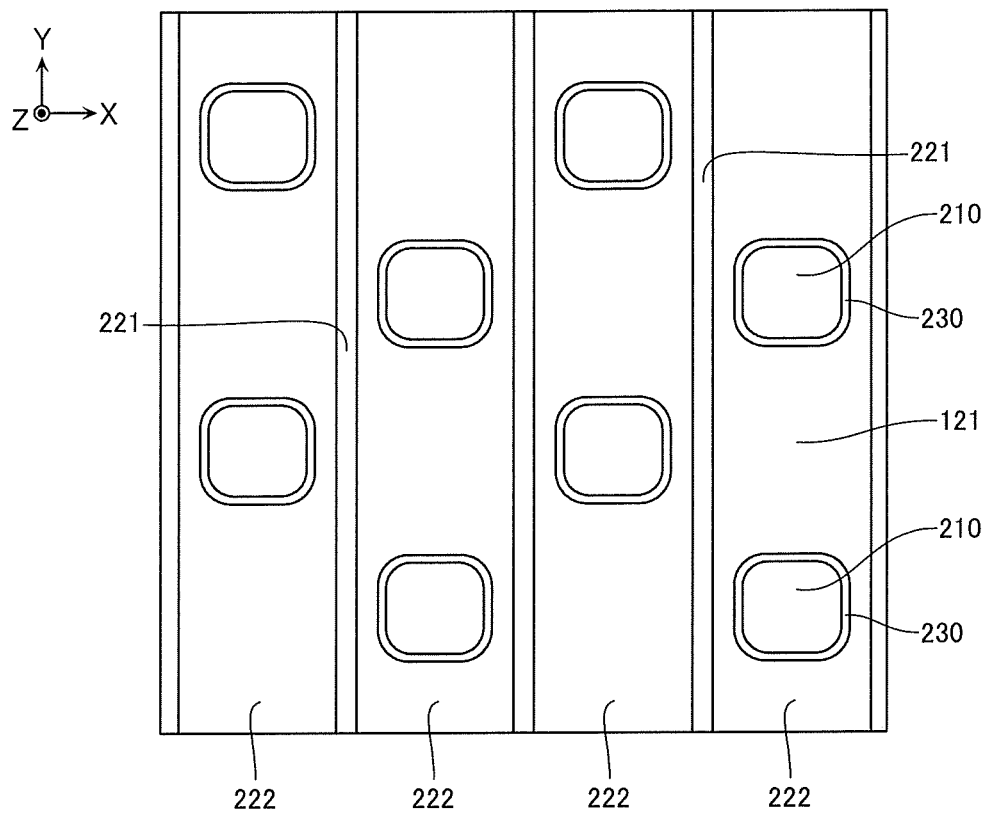
FIG. 45 is a schematic XY cross-sectional view showing a configuration example of a semiconductor memory device according to another example.

Moreover, in the first embodiment, for example, as described with reference to FIG. 10, and so on, the gate electrode of the word line select transistor was divided in the X direction. That is, two conductive portions 220 facing both side surfaces in the X direction of the semiconductor portion 210 configuring the channel region of the word line select transistor, were provided. However, as exemplified in FIG. 45, for example, the gate electrode of the word line select transistor may have a so-called surrounding gate type of structure. For example, a conductive portion 222 that surrounds outer peripheral surfaces of a plurality of the semiconductor portions 210 arranged in the Y direction, may be provided instead of the conductive portion 220. Note that the gate electrode of the word line select transistor connected to the lower end of the conductive portion 120, of the kind described with reference to FIGS. 43-44, for example, also may be divided in the X direction, or may have the so-called surrounding gate type of structure.

Moreover, in the above-exemplified configuration, a configuration such as the conductive portion 220 corresponding to the gate electrode of the word line select transistor extended in the Y direction, and a configuration such as the conductive portion 313 corresponding to the drain electrode of the word line select transistor extended in the X direction. However, the configuration such as the conductive portion 220 corresponding to the gate electrode of the word line select transistor may extend in the X direction, and the configuration such as the conductive portion 313 corresponding to the drain electrode of the word line select transistor may extend in the Y direction.

[Memory Cell MC]

Figure 46:
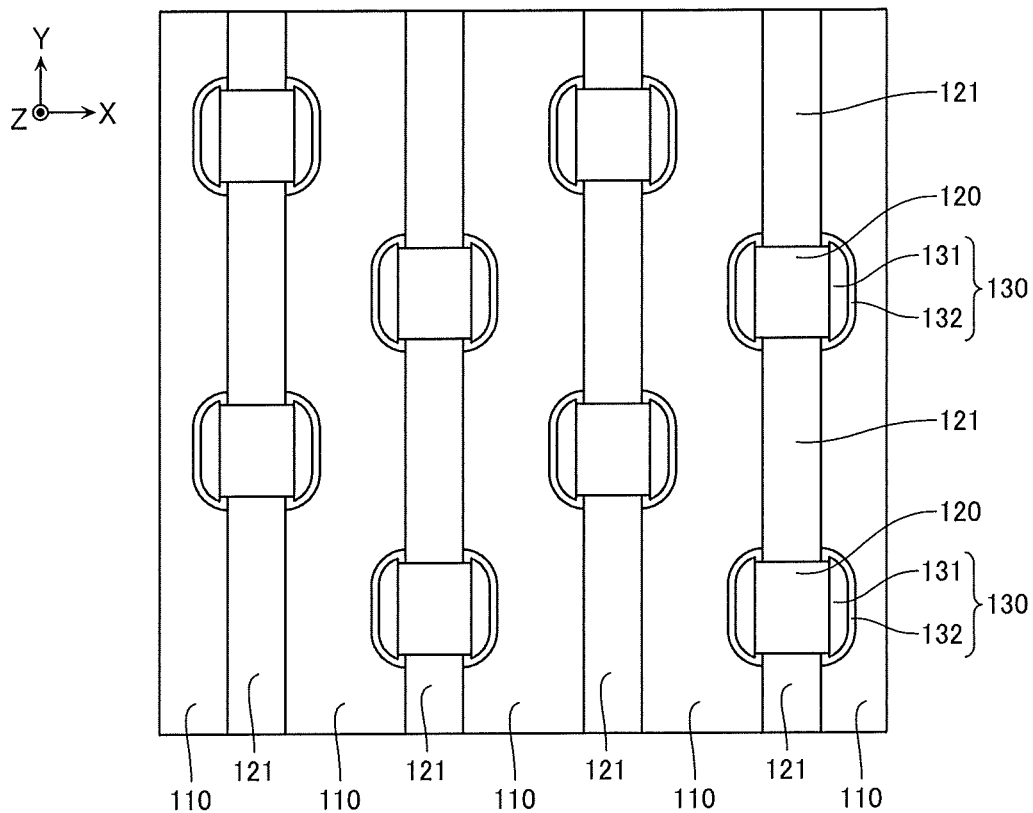
FIG. 46 is a schematic XY cross-sectional view showing a configuration example of a semiconductor memory device according to another example.

For example, in the step described with reference to FIGS. 28 and 29 of the first embodiment, part of the insulating film 132 of the gate insulating film 130 may be removed. This makes it possible to increase a facing area of the conductive portion 120 and the ferroelectric portion 131, as exemplified in FIG. 46, for example.

Figure 47:
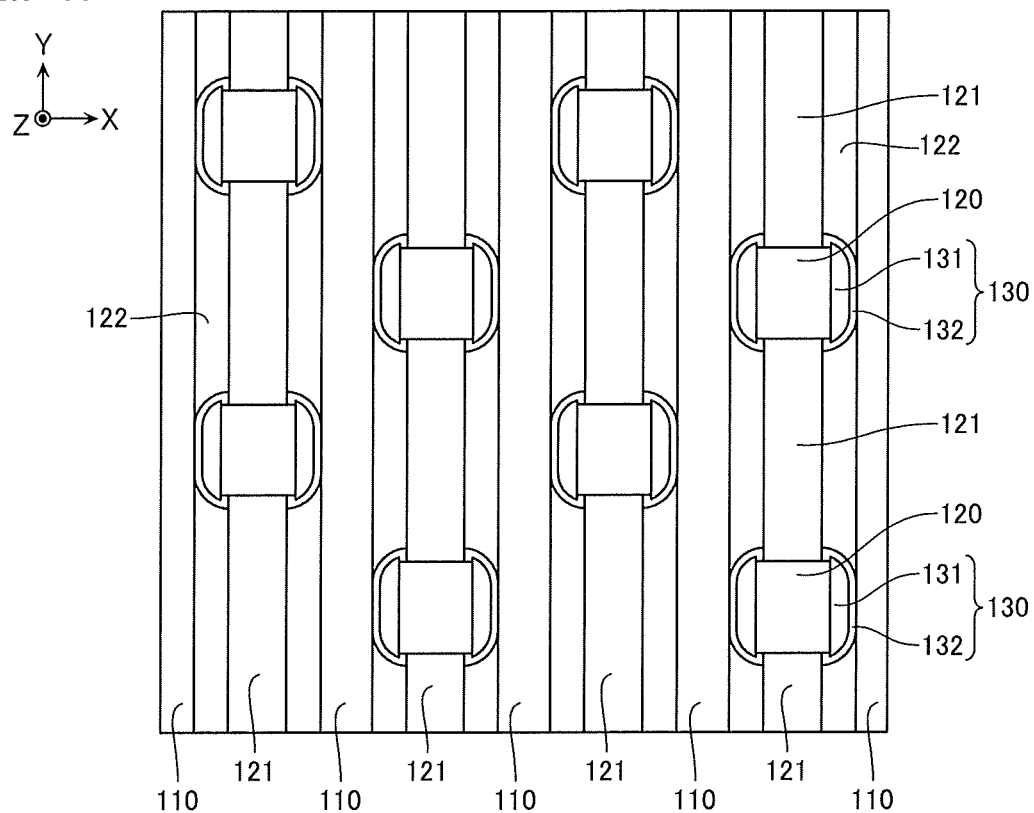
FIG. 47 is a schematic XY cross-sectional view showing a configuration example of a semiconductor memory device according to another example.

Moreover, as exemplified in FIG. 47, for example, an insulating portion 122 may be provided between the semiconductor portion 110 and the insulating portion 121. A width in the X direction of the insulating portion 122 is of about the same degree as a width in the X direction of the gate insulating film 130.

Figure 48:
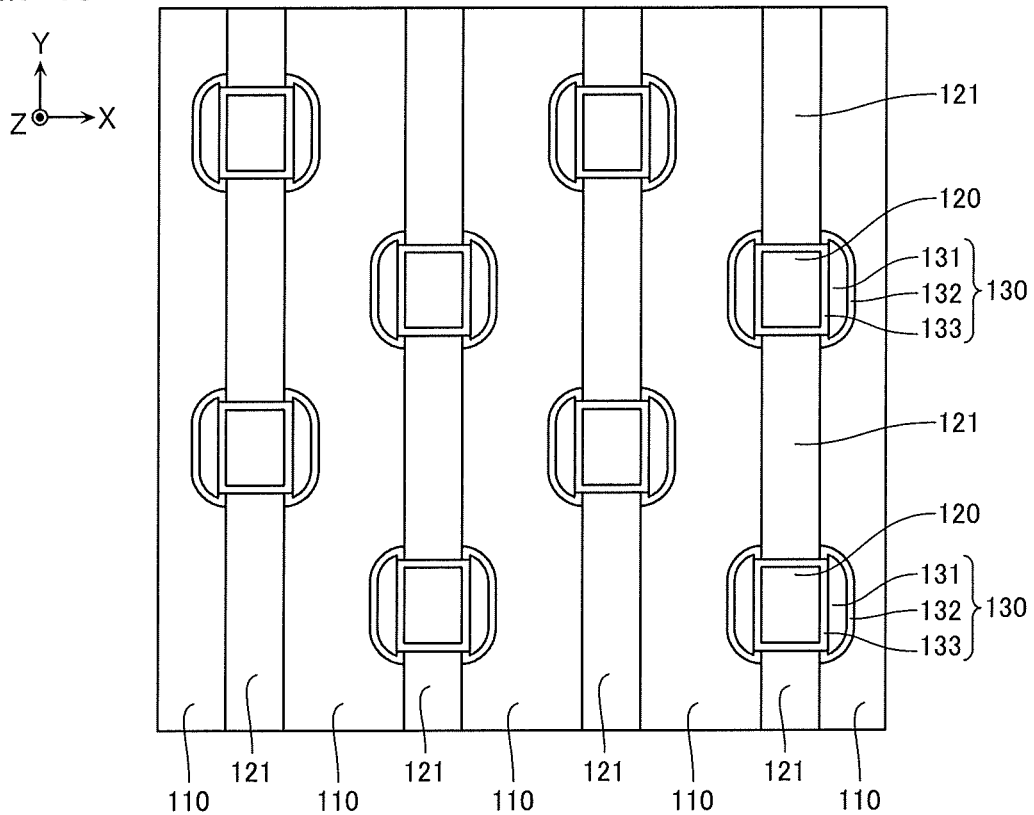
FIG. 48 is a schematic XY cross-sectional view showing a configuration example of a semiconductor memory device according to another example.

Moreover, a film configuration, and so on, of the gate insulating film 130 may be appropriately changed. For example, as shown in FIG. 48, an insulating film 133 of the likes of silicon oxide may be provided between the ferroelectric portion 131 and the conductive portion 120. Moreover, in the configuration exemplified in FIG. 48, for example, a semiconductor layer of the likes of polycrystalline silicon or another conductive portion may be provided as a floating gate instead of the ferroelectric portion 131, and a ferroelectric portion may be provided instead of the insulating film 133.

Moreover, a configuration where the gate insulating film 130 includes the ferroelectric portion 131 has been exemplified above. However, the gate insulating film 130 may include a configuration other than the ferroelectric portion 131, such as a floating gate of the likes of polycrystalline silicon, or a charge accumulating film with insulating properties of the likes of silicon nitride, for example.

Note that as mentioned above, the semiconductor memory device including the ferroelectric portion 131 is expected to operate with lower electric power consumption, compared to a semiconductor memory device utilizing a charge accumulating film of the likes of silicon nitride, for example. For example, in a semiconductor memory device utilizing a charge accumulating film of the likes of silicon nitride, sometimes, during the write operation and the erase operation, a voltage (for example, a voltage of about 15-25 V) larger than a power supply voltage (a voltage supplied to a power supply pad) is generated on an inside of the semiconductor memory device, and such a voltage is supplied to wirings such as the global word line and the source line. On the other hand, in the semiconductor memory device including the ferroelectric portion 131, sometimes, during the write operation and the erase operation, a voltage supplied to the wirings such as the global word line and the source line is a voltage less than or equal to the power supply voltage.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a plurality of first semiconductor portions arranged in a first direction intersecting a surface of the substrate;
a first gate electrode extending in the first direction, the first gate electrode facing the plurality of first semiconductor portions from a second direction intersecting the first direction;
a first insulating portion provided between the first semiconductor portions and the first gate electrode;
a first wiring separated from the first gate electrode in the first direction;
a second semiconductor portion connected to one end in the first direction of the first gate electrode and to the first wiring;
a second gate electrode facing the second semiconductor portion; and
a second insulating portion provided between the second semiconductor portion and the second gate electrode.

2. The semiconductor memory device according to claim 1, wherein
the first wiring extends in a direction which is one of the second direction and a third direction intersecting the first direction and the second direction, and
the second gate electrode extends in a direction which is the other of the second direction and the third direction.

3. The semiconductor memory device according to claim 1, comprising
a first contact and a second contact that are separated in a third direction intersecting the first direction and the second direction,
wherein the first semiconductor portion
extends in the third direction, and
comprises:
a first portion connected to the first contact;
a second portion connected to the second contact; and
a third portion provided between the first portion and the second portion, and
the first gate electrode faces the third portion of the first semiconductor portion.

4. The semiconductor memory device according to claim 1, comprising:
the plurality of first semiconductor portions extending in a third direction intersecting the first direction and the second direction;
a plurality of third semiconductor portions adjacent to the plurality of first semiconductor portions in the second direction, arranged in the first direction, and extending in the third direction;
a plurality of fourth semiconductor portions adjacent to the plurality of third semiconductor portions in the second direction, arranged in the first direction, and extending in the third direction;
the first gate electrode provided between the first semiconductor portion and the third semiconductor portion;
a third gate electrode provided between the first semiconductor portion and the third semiconductor portion, and adjacent to the first gate electrode in the third direction; and
a fourth gate electrode provided between the third semiconductor portion and the fourth semiconductor portion, a position of the fourth gate electrode being between a position of the first gate electrode and a position of the third gate electrode in the third direction.

5. The semiconductor memory device according to claim 4, comprising:
a second wiring adjacent to the first wiring in the third direction, and separated from the fourth gate electrode in the first direction;
a fifth semiconductor portion connected to one end in the first direction of the fourth gate electrode and to the second wiring;
a fifth gate electrode facing the fifth semiconductor portion;
a third insulating portion provided between the fifth semiconductor portion and the fifth gate electrode;
a third wiring adjacent to the second wiring in the third direction, and separated from the third gate electrode in the first direction;
a sixth semiconductor portion connected to one end in the first direction of the third gate electrode and to the third wiring;
the second gate electrode facing the second semiconductor portion and the sixth semiconductor portion; and
a fourth insulating portion provided between the sixth semiconductor portion and the second gate electrode, wherein the sixth semiconductor portion is adjacent to the second semiconductor portion in the third direction, and
a position of the fifth semiconductor portion is between a position of the second semiconductor portion and a position of the sixth semiconductor portion in the third direction.

6. The semiconductor memory device according to claim 1, comprising:
a sixth gate electrode extending in the first direction, and facing the plurality of first semiconductor portions from the second direction;
a fifth insulating portion provided between the first semiconductor portions and the sixth gate electrode;
a fourth wiring separated from the sixth gate electrode in the first direction;
a seventh semiconductor portion connected to one end in the first direction of the sixth gate electrode and to the fourth wiring;
a seventh gate electrode facing the seventh semiconductor portion; and
a sixth insulating portion provided between the seventh semiconductor portion and the seventh gate electrode, wherein
the first wiring is further from the substrate than the first gate electrode and the sixth gate electrode, and
the fourth wiring is closer to the substrate than the first gate electrode and the sixth gate electrode.

7. The semiconductor memory device according to claim 6, wherein
the sixth gate electrode is adjacent to the first gate electrode in a third direction intersecting the first direction and the second direction.

8. The semiconductor memory device according to claim 1, wherein
the first insulating portion includes hafnium (Hf) and oxygen (O).

9. The semiconductor memory device according to claim 8, wherein
the first insulating portion includes at least one of silicon (Si), scandium (Sc), yttrium (Y), titanium (Ti), vanadium (V), niobium (Nb), tantalum (Ta), zirconium (Zr), aluminum (Al), strontium (Sr), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

10. The semiconductor memory device according to claim 8, comprising a seventh insulating portion provided between the first semiconductor portion and the first insulating portion.

11. The semiconductor memory device according to claim 10, comprising a conductive portion provided between the seventh insulating portion and the first insulating portion.

12. The semiconductor memory device according to claim 1, comprising:
   an eighth insulating portion provided between the first semiconductor portion and the first insulating portion; and
   a charge accumulating portion provided between the eighth insulating portion and the first insulating portion.

13. The semiconductor memory device according to claim 1, wherein
   a write pulse is supplied to the first gate electrode in a write operation, and
   a pulse width of the write pulse is smaller than one micro second.

* * * * *